(12) United States Patent
Huang et al.

(10) Patent No.: US 8,987,913 B2
(45) Date of Patent: *Mar. 24, 2015

(54) DEFORMABLE NETWORK STRUCTURE

(71) Applicant: MonoLithe Semiconductor Inc., Taipei (TW)

(72) Inventors: Kevin T. Y. Huang, Taipei (TW); Hsiao-Huey Huang, Taipei (TW)

(73) Assignee: MonoLithe Semiconductor Inc., Taipei (TW)

( * ) Notice: Subject to any disclaimer, the term of this patent is extended or adjusted under 35 U.S.C. 154(b) by 106 days.

This patent is subject to a terminal disclaimer.

(21) Appl. No.: 13/902,948

(22) Filed: May 27, 2013

(65) Prior Publication Data

US 2013/0256921 A1 Oct. 3, 2013

Related U.S. Application Data

(63) Continuation-in-part of application No. 13/105,239, filed on May 11, 2011, now Pat. No. 8,471,387.

(60) Provisional application No. 61/395,342, filed on May 12, 2010.

(51) Int. Cl.
| | |
|---|---|
| *H01L 29/66* | (2006.01) |
| *H01L 23/528* | (2006.01) |
| *H01L 23/00* | (2006.01) |
| H01L 25/065 | (2006.01) |
| H01R 35/02 | (2006.01) |

(52) U.S. Cl.
CPC ............. *H01L 23/528* (2013.01); *H01L 24/66* (2013.01); *H01L 25/0655* (2013.01); *H01L 25/0657* (2013.01); *H01L 2924/01005* (2013.01); *H01L 2924/01006* (2013.01); *H01L 2924/01013* (2013.01); *H01L 2924/01029* (2013.01); *H01L 2924/01033* (2013.01); *H01L 2924/01047* (2013.01); *H01L 2924/01074* (2013.01); *H01L 2924/01079* (2013.01); *H01L 2924/14* (2013.01); *H01R 35/02* (2013.01); *H01L 2924/12041* (2013.01)
USPC .................. 257/773; 257/786; 257/E23.168; 257/E21.575; 257/E23.01

(58) Field of Classification Search
USPC .................. 257/773, 786, E23.168, E21.575, 257/E23.01
See application file for complete search history.

(56) References Cited

U.S. PATENT DOCUMENTS

| | | | |
|---|---|---|---|
| 6,344,616 | B1 | 2/2002 | Yokokawa |
| 6,370,964 | B1 | 4/2002 | Chang et al. |
| 6,743,982 | B2 | 6/2004 | Biegelsen et al. |
| 7,265,298 | B2 | 9/2007 | Maghribi et al. |
| 7,834,424 | B2 | 11/2010 | Peumans et al. |

(Continued)

*Primary Examiner* — Mohammad Islam
*Assistant Examiner* — Ankush Singal
(74) *Attorney, Agent, or Firm* — McClure, Qualey & Rodack, LLP

(57) ABSTRACT

Disclosed herein is a deformable network structure, which includes a first device portion, a second device portion and at least one connector interconnecting between the first device portion and the second device portion. Moreover, the second device portion can be electrically connected to the first device portion through one of the connectors. The first and second device portions respectively have a first and a second center. Each of the connectors may be deformable from an initial state to a final state, such that a first distance between the first and second centers in the final state varies by at least 10% of a second distance between the first and second centers in the initial state.

28 Claims, 21 Drawing Sheets

(56) References Cited

U.S. PATENT DOCUMENTS

| | | |
|---|---|---|
| 2002/0094701 A1 | 7/2002 | Biegelsen et al. |
| 2004/0192082 A1 | 9/2004 | Wagner et al. |
| 2008/0064125 A1 | 3/2008 | Peumans et al. |
| 2009/0067144 A1* | 3/2009 | Lanzara et al. ............... 361/776 |
| 2009/0283891 A1 | 11/2009 | Dekker et al. |
| 2010/0224950 A1 | 9/2010 | Dinyari et al. |
| 2011/0042832 A1 | 2/2011 | Peumans et al. |

* cited by examiner

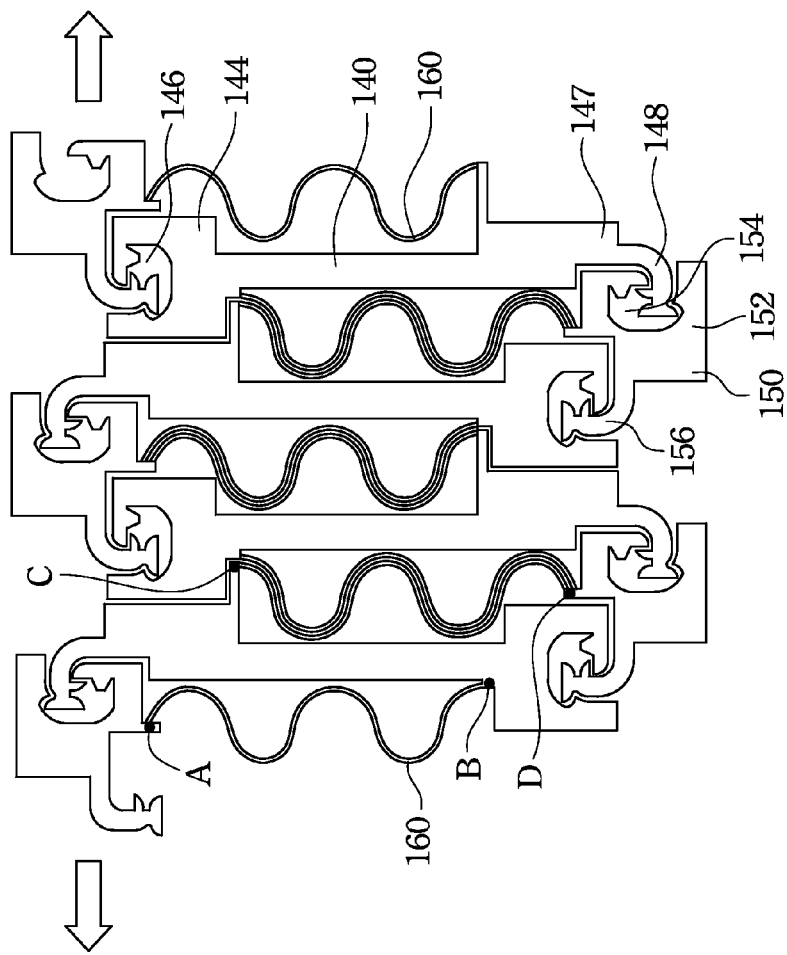
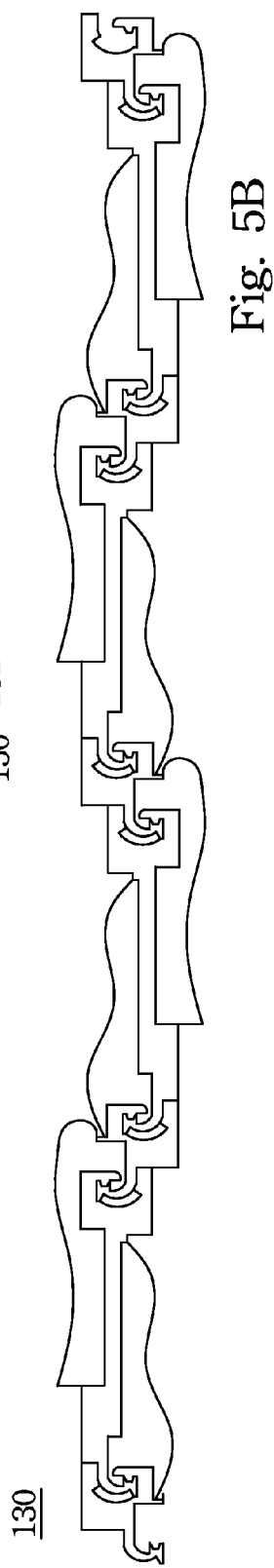
Fig. 5A
Fig. 5B

DEFORMABLE NETWORK STRUCTURE

RELATED APPLICATIONS

This application is a continuation in part of U.S. patent application Ser. No. 13/105,239 filed May 11, 2011, now U.S. Pat. No. 8,471,387, which claims priority to U.S. Provisional Application Ser. No. 61/395,342, filed May 12, 2010, the contents of each of which are herein incorporated by reference in their entirety.

BACKGROUND

1. Field of Invention

The present invention relates to a deformable network structure.

2. Description of Related Art

Technologies of fabricating semiconductor device have been developed for several decades, and manage to produce integrated circuits used in electronic devices. Such integrated circuits are individually connected through pick-and-place and wire-bonding processes and mounted on a substrate to provide desired functions of the device.

Another approach to fabricate electronic devices is the micro-electromechanical system (MEMS), which combines typical semiconductor processes and mechanical fabrications to accomplish certain functions of gadgets. In this technology, the MEMS gadget is individually equipped on a substrate or an article as well.

Many applications are limited in their scalability as related to the above inflexibility or otherwise. This has made certain circuit applications relatively difficult to implement with a variety of applications, such as those benefiting from large, complex networks and, often, high-density networks. Therefore, there exists in this art a need of a novel and cost-effective structure that would provide a flexible and large-area function.

SUMMARY

A deformable network structure is provided. According to one embodiment of the present disclosure, the deformable network structure comprises a first device portion, a second device portion and at least one connector interconnecting between the first device portion and the second device portion. Each of the first and second device portions comprises a semiconductor element, a light emitting element, a piezoelectric element, a circuit element, a sensor, an actuator, a transducer, an energy harvesting element, an energy storage element, an element that affects or interacts with surrounding electromagnetic field, air flow, mass flow, acoustic property or a radio frequency identification circuit element. Moreover, the second device portion can be electrically connected to the first device portion through one of the connectors. The first and second device portions respectively have a first and a second center. Each of the connectors may be deformable from an initial state to a final state, such that a first distance between the first and second centers in the final state varies by at least 10% of a second distance between the first and second centers in the initial state.

According to one example of the present disclosure, the first and second centers are geometric centers, mass centers or centers of symmetry.

According to one example of the present disclosure, each of the device portions and each of the connectors are part of, include a portion of, or share a common material layer which may be formed on a substrate.

According to one example of the present disclosure, the three connectors are substantially arranged on an identical level. In this example, an included angle formed between two adjacent connectors, in the extended state, is about 120 degrees.

According to one example of the present disclosure, the first and second device portions are of identical shapes.

According to another embodiment of the present disclosure, the deformable network structure comprises a central portion, at least three surrounding portions and at least three connectors. Each of the central portion and the surrounding portions comprises a semiconductor device, a light emitting element, a piezoelectric element, a circuit element, a sensor, an actuator, a transducer, an energy harvesting element, an energy storage element, an element that affects or interacts with surrounding electromagnetic field, air flow, mass flow, acoustic property or a radio frequency identification circuit element. The three surrounding portions are arranged around the central portion. Each of the surrounding portions is connected to the central portion through one of the connectors. The central portion has a first center while each of the surrounding portions has a second center. Each of the connectors may be deformable from an initial state to a final state, such that a first distance between the first center and one of the second centers in the final state varies by at least 10% of a second distance between the first center and the second center in the initial state.

According to one example of the present disclosure, the deformable network structure may further comprise a fourth surrounding portion and a fourth connector. The fourth connector is connected with the fourth surrounding portion and the central portion. In this example, all the connectors are substantially arranged on an identical level, and an included angle formed between two adjacent connectors in the extended state to be about 90 degrees.

According to one example of the present disclosure, each of the connectors wind around the central portion while each of the connectors is in the initial state.

According to one example of the present disclosure, the deformable network structure may further comprise a plurality of bridges in the initial or final state, and each of the bridges interconnects between portions of a connector or two of the connectors. In some example, the bridges may be arranged to interconnect between the central portion and one of the connectors.

According to one example of the present disclosure, at least one of the three connectors has a length that is different from the other two connectors.

According to one example of the present disclosure, all the three connectors are equi-length.

According to one example of the present disclosure, each of the connectors has a height that is different from the central portion.

According to one example of the present disclosure, each of the connectors comprises a plurality of arms and a plurality of 90 degree-rotation-restriction joints. Any two adjacent arms are joined by one of the 90 degree-rotation-restriction joints, and thus allowing each of the connectors to be deformable from a folded state to a straight state. In this example, the connector may further comprises a plurality of metal wires, and each of the metal wires is connected with one of the arms and one of the 90 degree-rotation-restriction joints that adjoins the arm. Furthermore, each of the 90 degree-rotation-restriction joints comprises a body and a first hook. The body has a first cavity for joining to one of the arms. The first hook extends from the body and is operable to join to another arm. In addition, each of the arms comprises an end having a second cavity for housing the first hook; and an opposite end having a second hook that extends into one of the first cavity.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows:

FIG. 5A is a top view schematically illustrating a connector in an initial state according to one embodiment of the present disclosure;

FIG. 5B is a top view illustrating an extended state of the connector depicted in FIG. 5A;

DETAILED DESCRIPTION

Figure 1A:
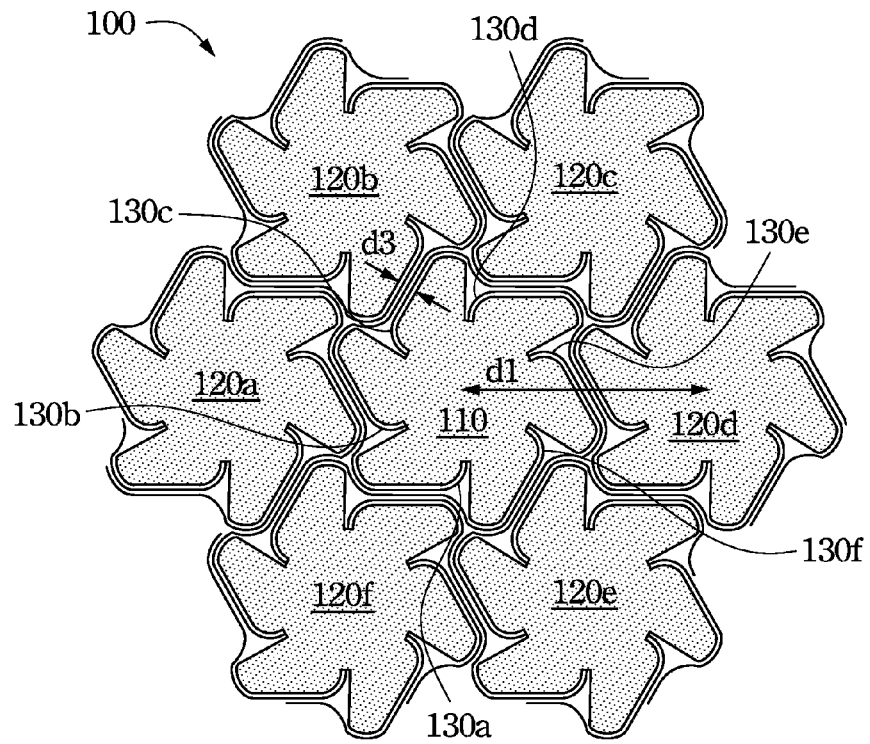
FIG. 1A is a top view schematically illustrating a deformable network structure in an initial state according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Disclosed herein is a deformable network structure, which may be extended from an initial state to an extended state in one embodiment of the present disclosure. The deformable network structure comprises a plurality of device portions and a plurality of connectors. Any two adjacent device portions are connected by one of the connectors, and thus forming the deformable network structure. The connectors may be extended while an external force or tension is applied thereto. Therefore, a distance between two adjacent device portions may be increased while the connector is extended. As a result, the network structure may be extended from an initial state to an extended state.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, the term "breaking strain" refers to the strain at which a material fractures into two or more pieces under tensile or compressive stress or other deformation in the field of material science. In the case of pure elongation of a material, the breaking strain corresponds to the strain obtained when subjected to the ultimate stress of the material.

Hereinafter, several example embodiments are described in detail with reference to figures.

Figure 1B:
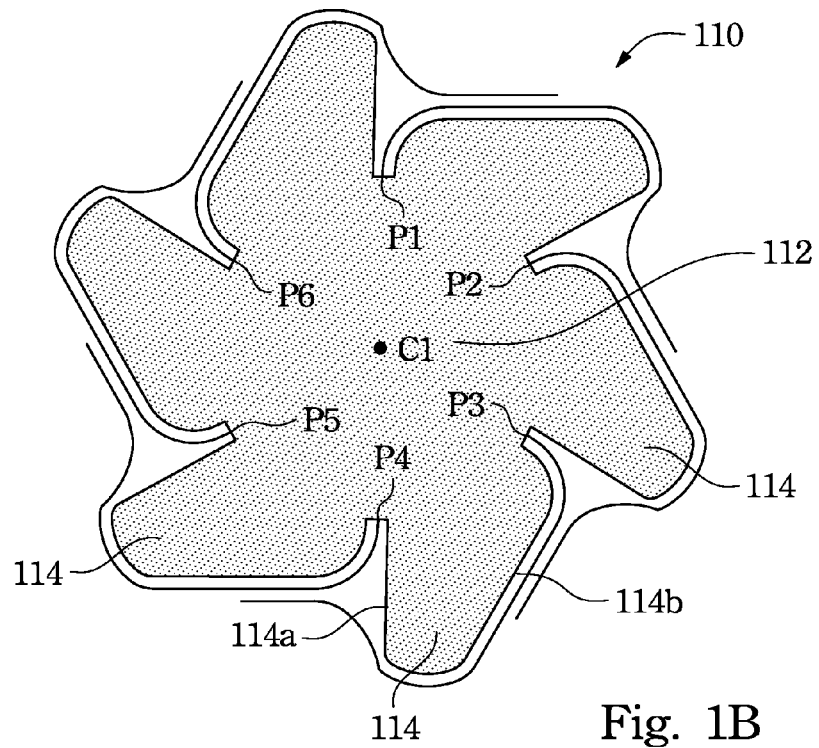
FIG. 1B is an enlarged drawing of the central portion in FIG. 1A.

FIG. 1A is a top view schematically illustrating a deformable network structure 100 in an initial state according to one embodiment of the present disclosure. The deformable network structure 100 includes a central portion 110, six surrounding portions 120*a*-120*f*, and six connectors 130*a*-130*f*. FIG. 1B depicts an enlarged drawing of the central portion 110.

The six surrounding portions 120*a*-120*f* are disposed around the central portion 110, and spaced apart from the central portion 110. Each of the central portion 110 and the surrounding portions 120*a*-120*f* includes a semiconductor element such as a transistor, light emitting diode, logic circuit, or sensing device, for example. The shape of the surrounding portion may be the same as or different from the central portion 110. In this embodiment, each of the surrounding portions 120*a*-120*f* has a shape that is the same as the central portion 110. In one example, the surrounding portions 120*a*-120*f* and the central portion 110 are arranged on an identical level.

Each of surrounding portions 120*a*-120*f* is connected or coupled to the central portion 110 through one of the six connectors 130*a*-130*f*. Specifically, the connectors 130*a*-130*f* are respectively connected to the surrounding portion 120*a*-120*f*. Each of the connectors 130*a*-130*f* may include a conductive material so that each of the surrounding portions 120*a*-120*f* may be electrically connected to the central portion 110. In particular, one or more metal layer(s) may be formed in each of the connectors 130*a*-130*f*, and thus electric signals or power may be transmitted between the central portion 110 and the surrounding portions. In the case where multiple metal layers are employed, one or more insulator layers may be disposed between these metal layers. In examples, each of the connectors 130*a*-130*f* has a width or height of nanoscale or microscale.

Figure 1C:
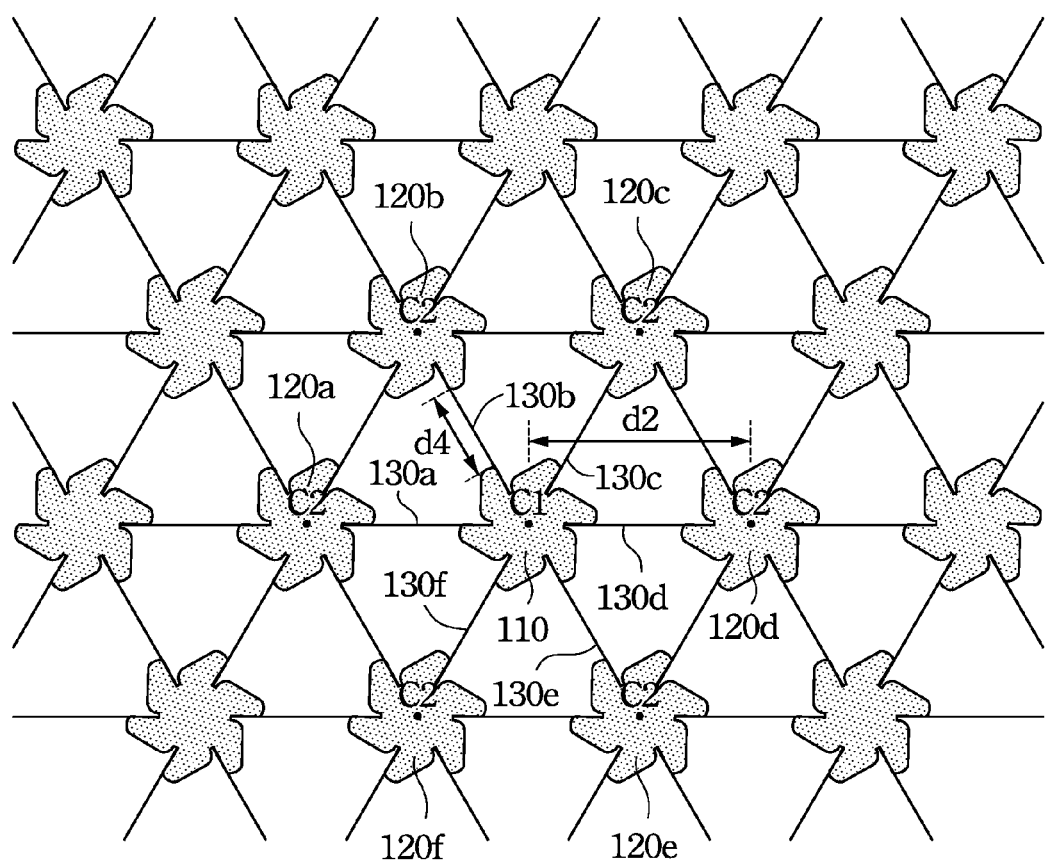
FIG. 1C is a top view schematically illustrating a deformable network structure in an extended state.

In the initial state, as depicted in FIG. 1A, the connectors 130*a*-130*f* wind and/or twist in the space existed between the central portion 110 and the surrounding portions 120*a*-120*f*. While an external force is applied to the network structure 100, the network structure 100 may be deployed or extended, and then the spacing interval, between the central portion and surrounding portions 120*a*-120*f*, may be enlarged. Accordingly, the network structure 100 may be transformed into a final state, an extended state is depicted in FIG. 1C. Each of the connectors 130*a*-130*f* is stretched as a substantially straight line so as to increase the distance between two device portions (i.e. the central portion and the surrounding portion). The distance d2, between the center C1 of the central portion and the center C2 of the surrounding portion in the case of an extended final state, may be increased at least 1.1 fold of the distance d1, between the center C1 and the center C2 in the initial state. In examples, the distance d2 is at least 2 folds, 5 folds, or 10 folds of the distance d1. The center described above may be a geometric center, a mass center or a center of symmetry, for example. According to another aspect of the present disclosure, a minimum distance d4 existed between the central portion 110 and the surrounding portions 120*a*-120*f* in the case of extended final state is at least 1.1 fold of a minimum distance d3 existed between the central portion 110 and the surrounding portions 120*a*-120*f* in the initial state. In examples, the distance d4 may be 2 folds, 5 folds, or 10 folds of the distance d3.

In this embodiment, each of the central portion 110 and the surrounding portions 120*a*-120*f* includes a body 112 and six petal portions 114 extended from the body 112, as depicted in FIG. 1B. At least one of the petal portions 114 has a straight edge 114*a* and a curved edge 114*b*. Specifically, each of the petal portions 114 has a similar contour, and is composed of the straight edge 114*a* and the curved edge 114*b*. The connectors 130*a*-130*f* are connected to the joint points P1-P6 of the body 112. The distances between the center C1 and the joint points P1-P6 are equal, and all the six connectors are equi-length in this embodiment.

In one example, each of the device portions and each of the connectors are part of, including a portion of, or share a common material layer which may be formed on a substrate such as a silicon wafer or a metal layer. In particular, the device portions and the connectors may comprise at least one of a conductive layer, silicon oxide layer and silicon nitride layer.

Figure 2A:
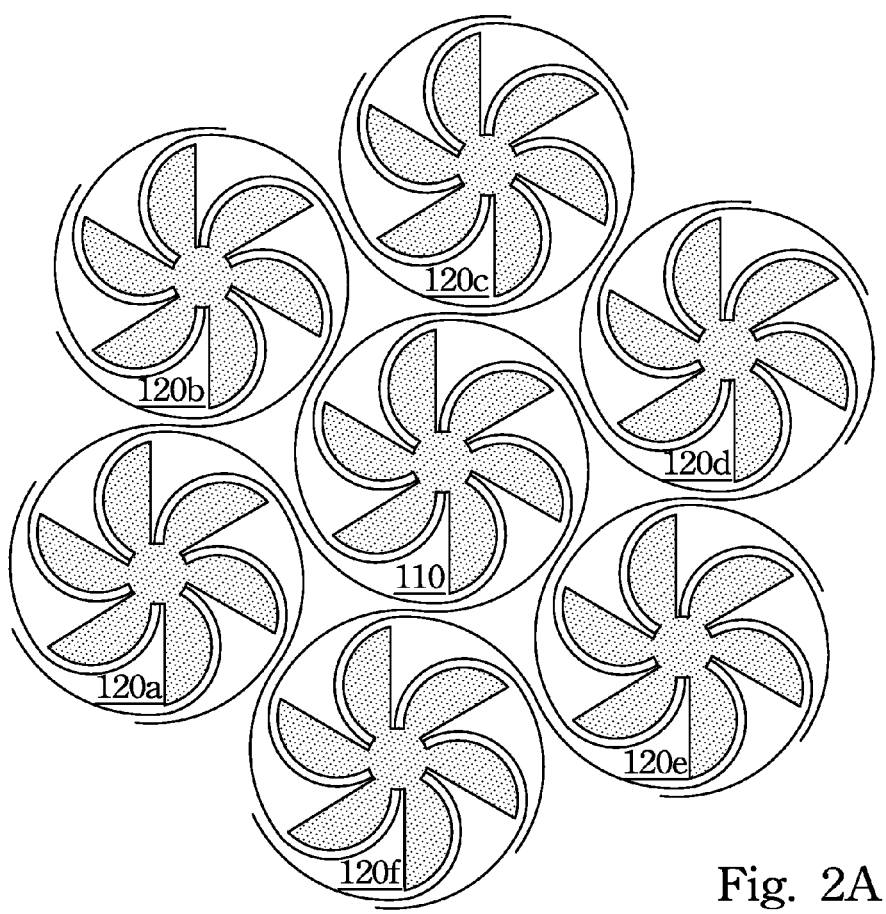
FIG. 2A is a top view schematically illustrating a deformable network structure in an initial state according to another embodiment of the present disclosure.
Figure 2B:
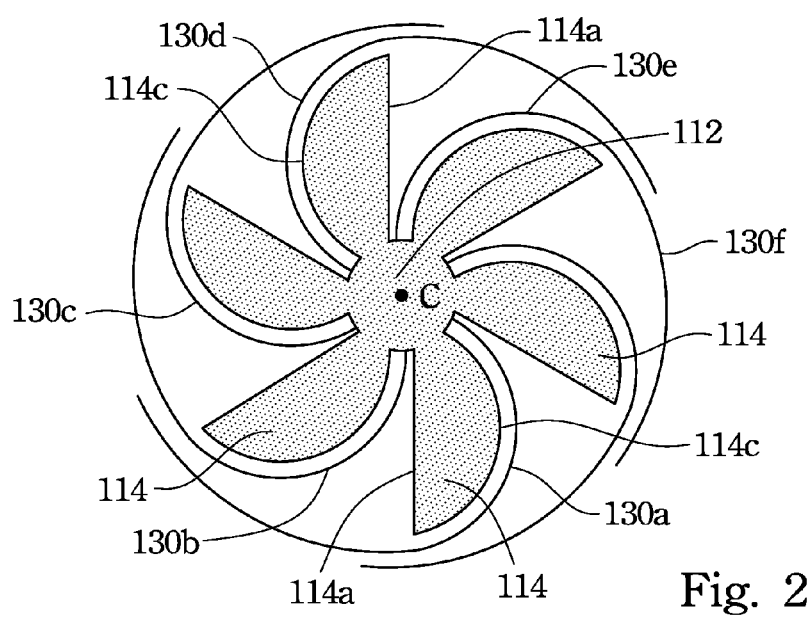
FIG. 2B depicts an enlarged drawing of the central portion in FIG. 2A.

FIG. 2A is a top view schematically illustrating a deformable network structure 100 in an initial state according to another embodiment of the present disclosure. The deformable network structure 100 includes a central portion 110, six surrounding portions 120*a*-120*f*, and six connectors 130*a*-130*f*. FIG. 2B depicts an enlarged drawing of the central portion 110. The network structure 100 depicted in FIG. 2A is configured in a way similar to FIG. 1A.

In this embodiment, each of the surrounding portions 120*a*-120*f* has a shape that is the same as the central portion 110. Further, each of these device portions includes a body 112 and six petal portions 114. The body 112 is substantially circular in shape, and each of the petal portions 114 has a straight edge 114*a* and an arc edge 114*c*. The petal portion 114 has a larger area than the body 112. However, in other examples, the area of the petal portion 114 may be smaller that of the body 112. One or more semiconductor element may be disposed on the petal portions 114 and/or the body 112. The connectors 130*a*-130*f* extend from the body 112 to the surrounding portions 120*a*-120*f* respectively, along the arc edges 114*c* and through the space between the central portion 114 and the surrounding portions 120*a*-120*f*. Each of the connectors 130*a*-130*f* may have a structure similar to those described above.

Figure 3A:
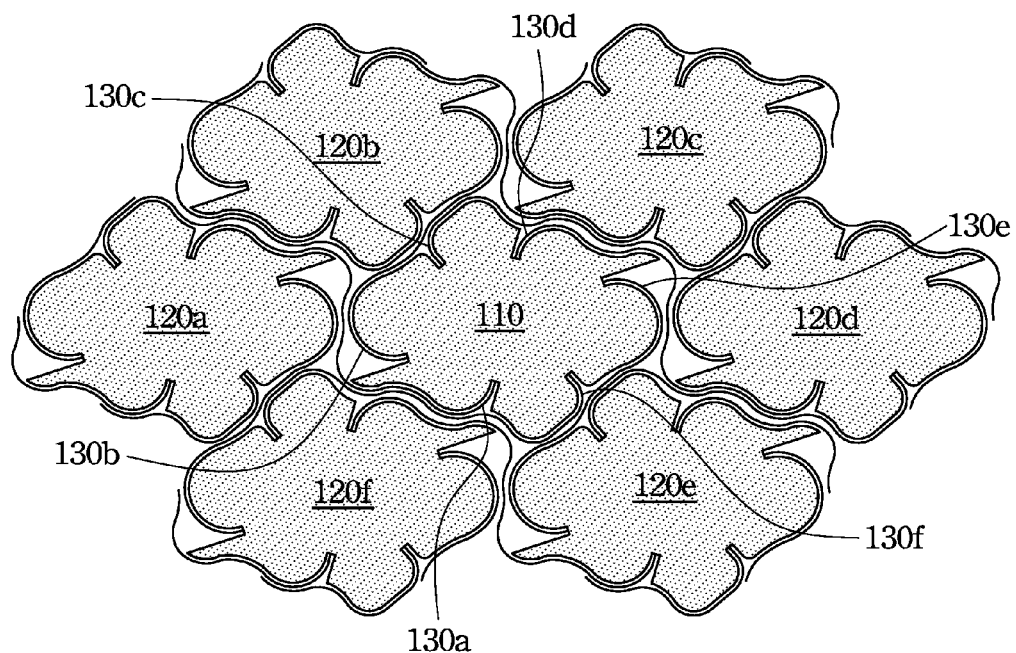
FIG. 3A is a top view schematically illustrating a deformable network structure in an initial state according to another embodiment of the present disclosure.
Figure 3B:
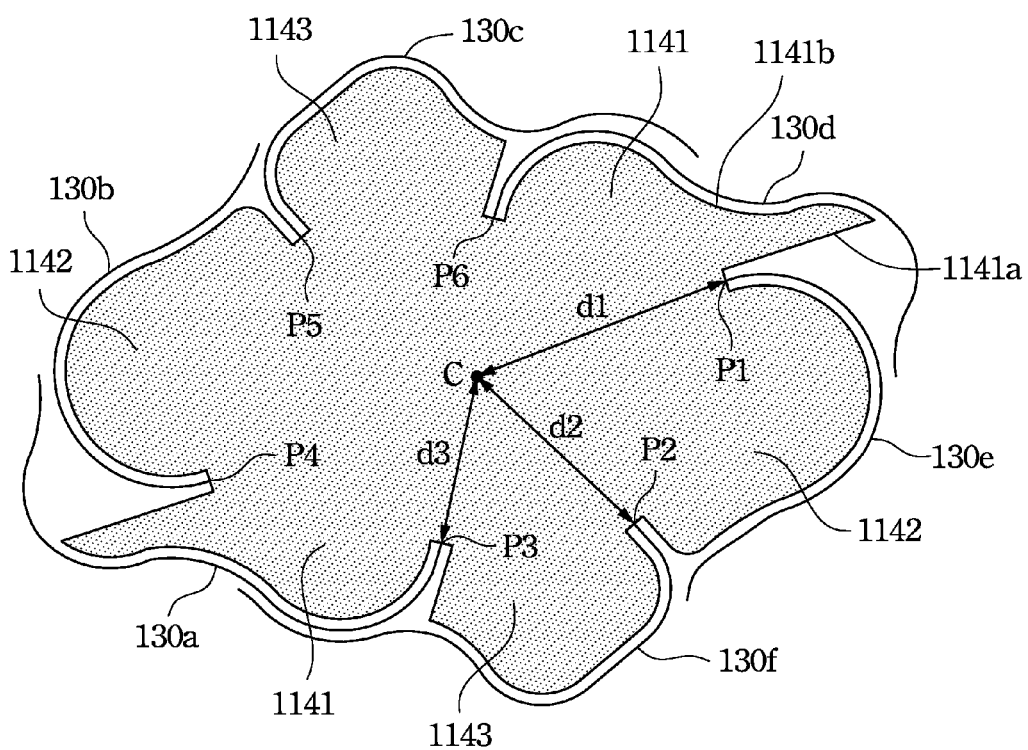
FIG. 3B is an enlarged drawing of the central portion in FIG. 3A.
Figure 3C:
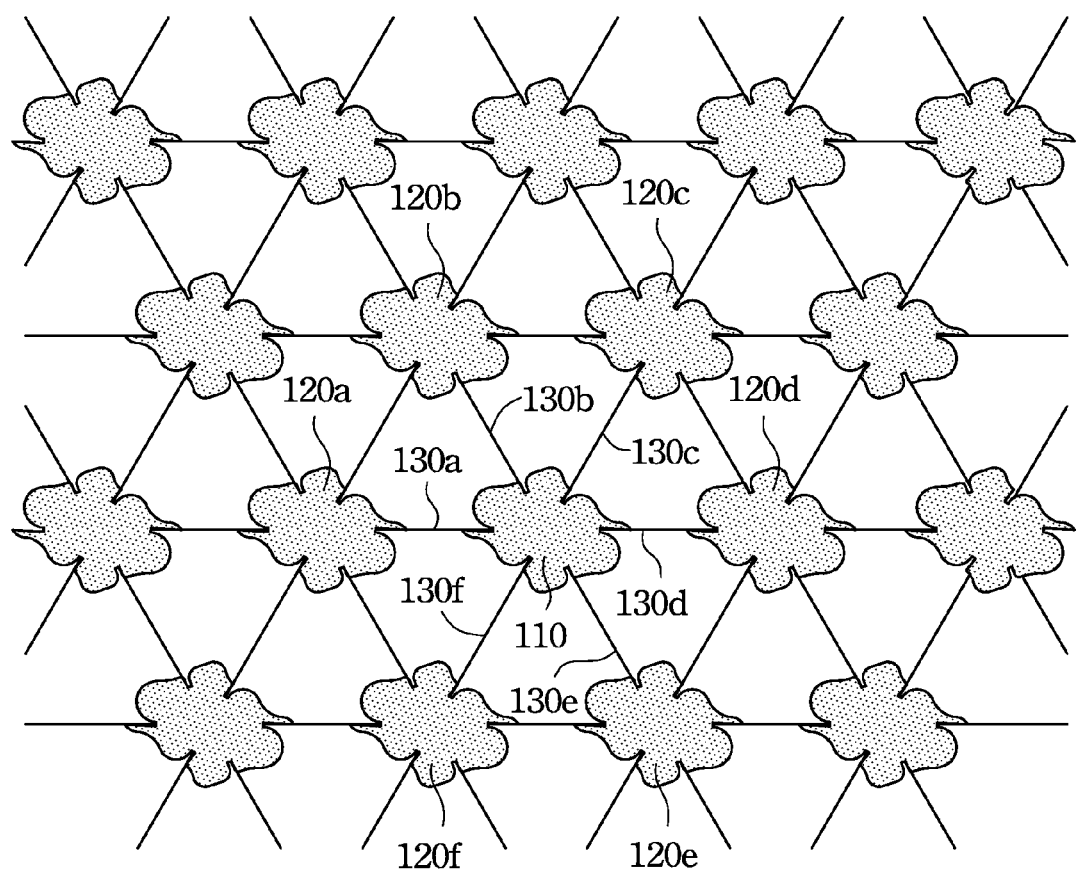
FIG. 3C is a top view schematically illustrating a deformable network structure in an extended state.

FIG. 3A is a top view schematically illustrating a deformable network structure 100 in an initial state according to another embodiment of the present disclosure. The deformable network structure 100 includes a central portion 110, six surrounding portions 120*a*-120*f*, and six connectors 130*a*-130*f*. FIG. 3B depicts an enlarged drawing of the central portion 110. FIG. 3C depicts the network structure 100 in an extended state.

In this embodiment, each of the surrounding portions 120*a*-120*f* has a shape that is the same as the central portion 110. Each of these device portions includes a body 112, three pairs of petal portions 1141, 1142 1143, as illustrated in FIG. 3B. Each of the pairs of petal portions is symmetric with respect to a geometric center C. In one example, at least one pair of petal portion, for example petal portion 1141 has a straight edge 1141*a* and a curved edge 1141*b*. However, in other examples, all pairs of the petal portion 1141, 1142 1143 may have shapes consisting of curved edges. It is to be noted that the device portion (i.e. the central portion or surrounding portions) may have an asymmetric shape although the device portion depicted in FIG. 3B is symmetric.

The central portion 110 has six joint points P1-P6 for respectively connecting to the connectors 130a-130f, as depicted in FIG. 3B. The distance d1 between the center C and the first joint point P1 is greater than the distance d2 between the center C and the second joint point P2. Also, the distance d2 is greater than the distance d3 between the center C and the third joint point P3. The first, second, and third joint points P1, P2, P3 are respectively connected to the connector 130e, 130f, 130a. For the purpose of getting an equal distance, between two centers of any two adjacent device portions, in the extended state, the length of the connector 130a is longer than that of the connector 130f, which is longer the connector 130e. Therefore, even at least one of connectors 130a-130f may have a different length from another one, but the network structure 100 in the extended state may be configured to have a regular structure. In one example, each distance between two centers of any two adjacent device portions may be kept as a constant although one of the connectors 130a-130f has a different length from another one.

Figure 4A:
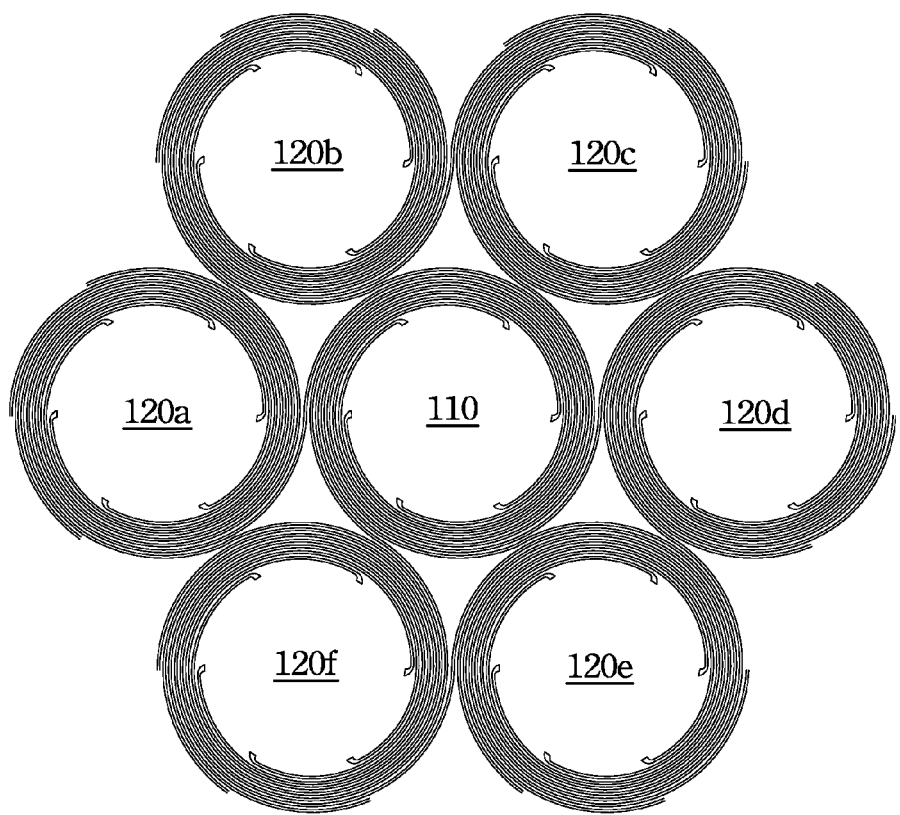
FIG. 4A is a top view schematically illustrating a deformable network structure in an initial state according to another embodiment of the present disclosure.
Figure 4B:
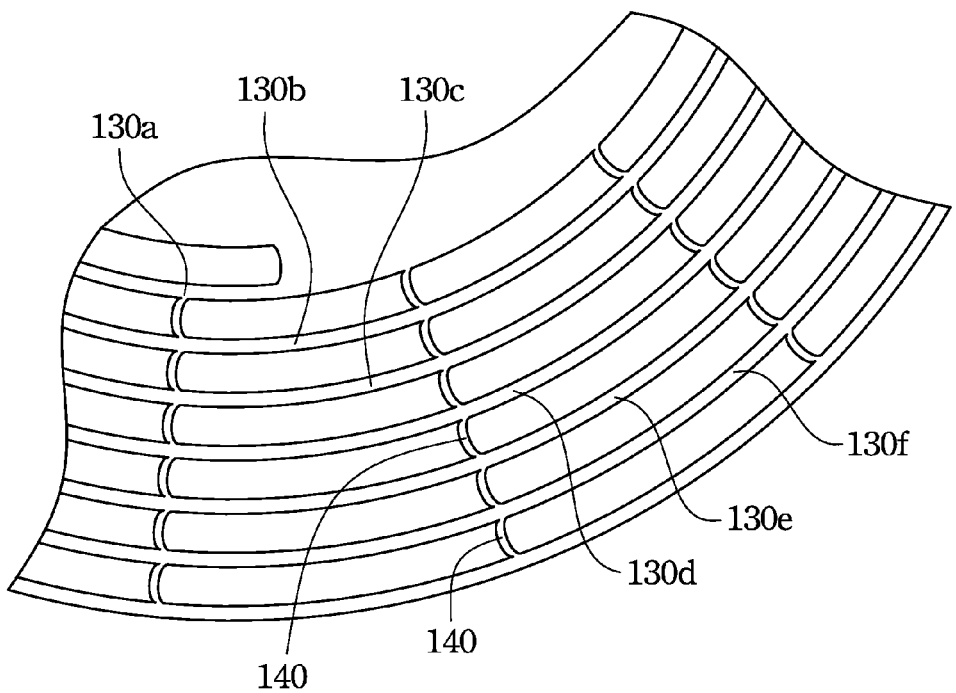
FIG. 4B is an enlarged drawing of the connectors in an initial state according to one embodiment of the present disclosure.

FIG. 4A is a top view schematically illustrating a deformable network structure 100 in an initial state according to another embodiment of the present disclosure. FIG. 4B depicts an enlarged drawing of the connectors 130a-130f. The network structure 100 depicted in FIG. 4A is configured in a way similar to those described above. The central portion 110 is substantially shaped in a circle, in which semiconductor element may be disposed. The six connectors 130a-130f extended from the central portion 110 wind around the central portion 110, and are further connected to the surrounding portion 120a-120f respectively. The number of windings may be adjusted to meet a desired structure of the extended state. In one example, the deformable network structure 100 may further comprise a plurality of bridges 140 for tying the connectors 130a-130f together in the initial state. Each of the bridges interconnects between two of the connectors. The bridges 140 may be broken while the connectors are stretched due to the extension of the network structure 100. The bridges 140 may have a lower mechanical strength than the connectors, so that the bridges 140 are easier to be broken. In one example, each of the bridges 140 has a width that is less than each of the connectors 130a-130f. In another example, each of the bridges 140 is configured to have a curved contour that presents a small radius of curvature or a sharp corner as stress-concentration sites. The bridges 140 may be configured to interconnect between the central portion 110 and one of the connectors 130a-130f as well. Any embodiment described in the present disclosure may comprise the bridges 140 described herein. In one embodiment, the bridges 140 interconnect between the at least one of the connectors 130a-130f and a device portion (i.e. the central portion or the surrounding portion) in the initial state or the final state. In another embodiment, the bridges 140 may interconnect between two different portions of an identical connector. That is, the bridges 140 interconnect between a portion of the connector and another portion of the connector in the initial state or the final state.

Figure 4C:
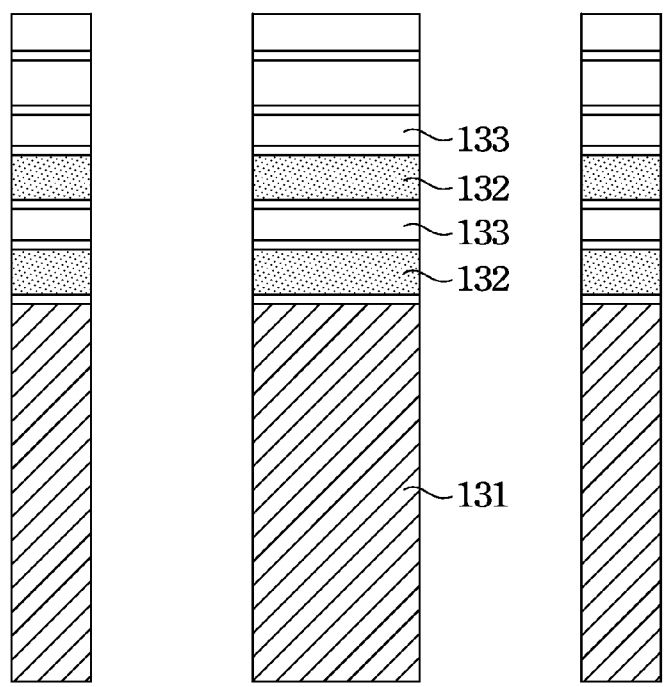
FIGS. 4C-4D are cross-sectional views schematically illustrating a connector according to embodiments of the present disclosure.
Figures 4D, 4E:
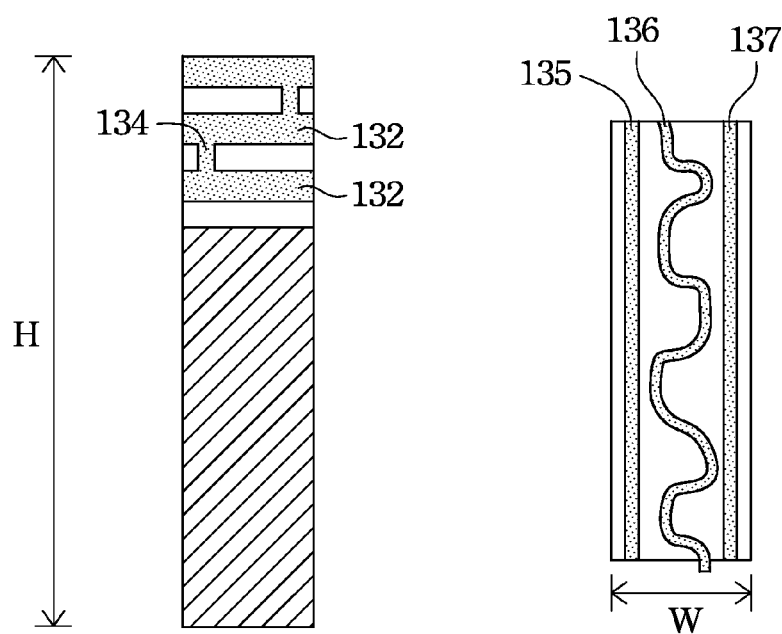
FIG. 4E is a top view schematically illustrating a connector according to one embodiment of the present disclosure.

FIG. 4C is a cross-sectional view schematically illustrating one of the connector 130a-130f according to one embodiment of the present disclosure. The connector comprises a substrate 131, a plurality of dielectric layers 133, and a plurality of metal layers 132. The substrate 131 may be part of a silicon wafer or metal layer, for example. The dielectric layers 133 may comprise silicon oxide, silicon nitride or the like. The metal layers 132 may comprise copper, aluminum, silver or gold. In one example, there exists a dielectric layers 133 disposed between two adjacent metal layers 132. In another example, one metal layer may be electrically connected to another metal layer through the connecting via 134, as depicted in FIG. 4D. In some examples, a plurality of conductive wires 135, 136, 137 may be formed in a connector, as depicted in FIG. 4E that illustrates a top view of a connector. Each of the conductive wires 135, 136, 137 may has a different shape, size or material. In other examples, the height H of each of the connectors 130, depicted in FIG. 4D, may be different from the central portion. In examples, the width W of the connector, depicted in FIG. 4E, may be about 10 nm to about 50 µm, and the height of the connector may be about 1 µm to about 500 µm.

Figure 4F:
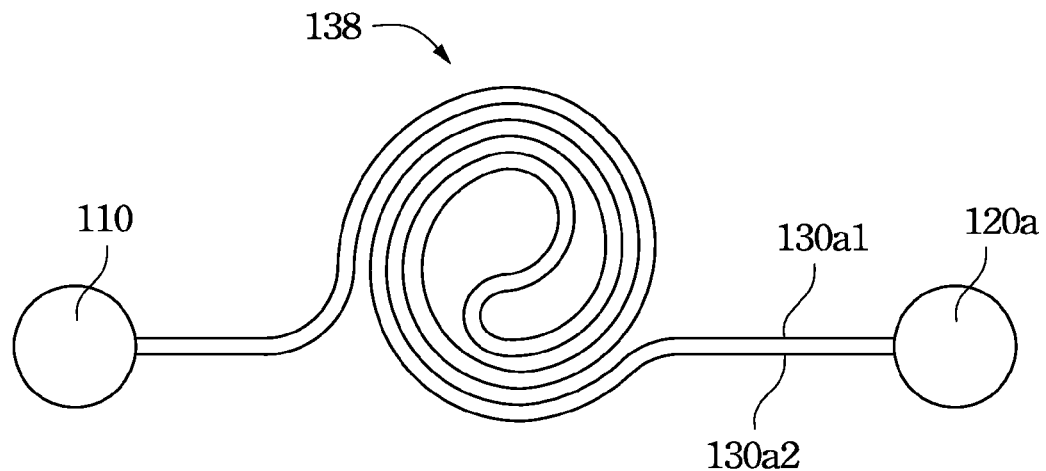
FIG. 4F is a top view schematically illustrating another arrangement of a connector according to one embodiment of the present disclosure.

In one embodiment, the aforesaid connector has a parameter Z and a breaking strain. The parameter Z is defined by the following formula:

$$Z = \left| \frac{\left(-\frac{W}{2}\right)\left(\frac{1}{R_f} - \frac{1}{R_i}\right)}{1 - \frac{W}{2R_i}} \right|;$$

in which W represents a width of a portion of the connector, $R_f$ represents a radius of curvature, as measured at the mid-line of the connector, of the portion of the connector in the extended final state, and $R_i$ represents a radius of curvature, as measured at the mid-line of the connector, of the portion of the connector in the initial state. The parameter Z of the connector is less than the breaking strain of the connector. For the purpose of illustrating the definition of the parameter Z, FIG. 4H and FIG. 4I depict a portion of the connector 130 respectively in the initial state and in the final state according to one embodiment of the present disclosure. The portion of the connector 130 has a width W and a mid-line 130' which has a locus substantially positioned at the half of the width W and along the extending direction of the connector 130. The radius of curvature $R_i$ in the initial state and the radius of curvature $R_f$ in the final state are measured at the mid-line 130'. Accordingly, in the present disclosure, the term "radius of curvature" of a connector or a portion of the connector refers to the radius of curvature of the mid-line of the associated portion of the connector, in which the mid-line extends along the extending direction of the connector 130 and has a locus substantially positioned at the half of the width W.

Furthermore, a positive value of $$\frac{\left(-\frac{W}{2}\right)\left(\frac{1}{R_f} - \frac{1}{R_i}\right)}{1 - \frac{W}{2R_i}}$$

corresponds to tensile strain while a negative value of $$\frac{\left(-\frac{W}{2}\right)\left(\frac{1}{R_f} - \frac{1}{R_i}\right)}{1 - \frac{W}{2R_i}}$$

corresponds to compressive strain. The parameter Z estimates the strain due to curving or un-curving or straightening the connector only. For example, if a section of a connector is further stressed after being pulled straight, additional tensile strain needs to be added to the Z parameter to accurately estimate the strain of total deformation.

In another embodiment, the connector has a parameter Y that is less than the breaking strain of the connector. The parameter Y is defined by the following formula:

$$Y = \left| \frac{\left(\frac{W}{2}\right)\left(\frac{1}{R_f} - \frac{1}{R_i}\right)}{1 + \frac{W}{2R_i}} \right|;$$

wherein W represents a width of a portion of the connector, $R_f$ represents a radius of curvature, as measured at a mid-line of the connector, of the portion of the connector in the final state, and $R_i$ represents a radius of curvature, as measured at the mid-line of the connector, of the portion of the connector in the initial state.

Accordingly, in one embodiment of the present disclosure, the connector may be transformed from the initial state into the final state or vice versa, and this transformation may be repeatedly performed. In another embodiment, the connector may be transformed from the final state into an intermediate state between the final and the initial states when external force applied thereto is relieved.

In still another embodiment, a first distance between the first and second centers in the final state varies at least 10% of a second distance between the first and second centers in the initial state contributed by a deformation of the connector. For example, the first distance between the first and second centers in the final state is less than 90% of the second distance between the first and second centers in the initial state. Alternatively, the first distance between the first and second centers in the final state is greater than 1.1 fold of the second distance between the first and second centers in the initial state.

In yet another embodiment, each of the first and second device portions comprises a semiconductor element, a light emitting element, a piezoelectric element, a circuit element, a sensor, an actuator, a transducer, an energy harvesting element, an energy storage element, a radio frequency identification circuit element, or an element that affects or interacts with surrounding electromagnetic field, air flow, mass flow or acoustic property.

In yet another embodiment, each of the first and second device portions comprises a body and a plurality of petal portions extended from the body. The connector physically interconnects between the bodies of the first and second device portions. The connector extends along the edge of one of the petal portions of the first device portion as well as along edge of one of the petal portions of the second device portion in the initial state or the final state, as shown in FIG. 1A and FIG. 2A. Furthermore, each of the petal portions comprises an edge of gradual transition in curvature.

The connector may have a different morphology than those described above. In one embodiment, the connector may be coiled at a position between any of two device portions, as depicted in FIG. 4F. Particularly, the connector 130a may have a coiled portion 138 which winds around itself multiple times, but without going around any device portion. It is noted that each of the connector may be composed of one or more sub-connectors. In one example, the connector 130a is composed of two sub-connectors 130a1, 130a2. Both the sub-connectors 130a1, 130a2 are substantially in parallel. It is not necessary that the connector have to be coiled up in complete circles. For example, the connector may twist between two device portions.

Figure 4G:
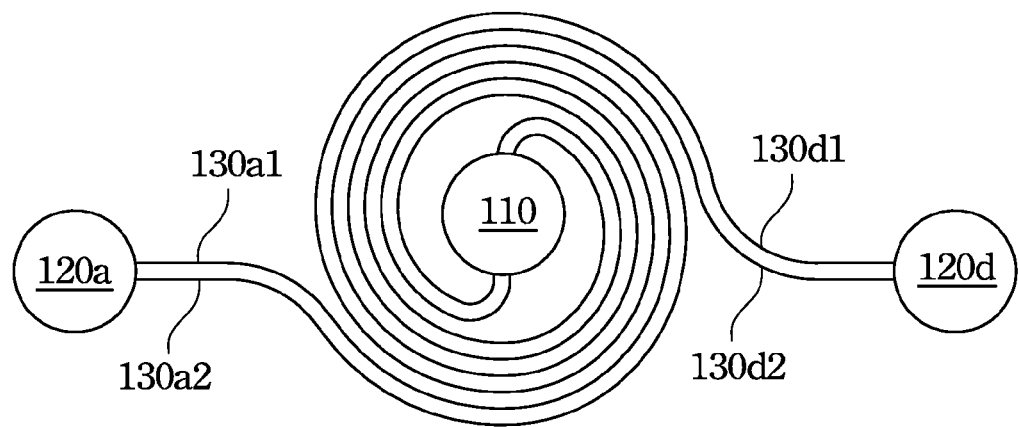
FIG. 4G is a top view schematically illustrating still another arrangement of a connector according to one embodiment of the present disclosure.
Figure 4H:
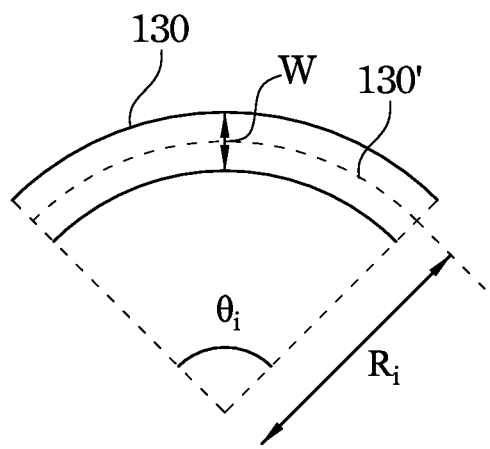
FIG. 4H and FIG. 4I are top views schematically illustrating a portion of the connector respectively in the initial state and in the final state according to one embodiment of the present disclosure.
Figure 4I:
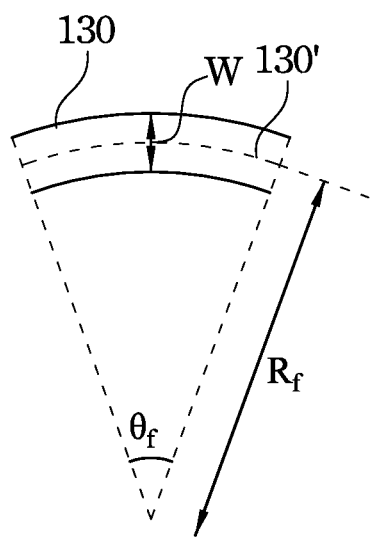

In another embodiment, the connectors may wind around some device portions whereas other device portions are not wound by any connector, as depicted in FIG. 4G. Particularly, the connector 130a, 130d substantially wind around the central portion 110, but does not go around the surrounding portions 120a, 120d. In this embodiment, each of the connectors 130a, 130d may be composed of one or more sub-connectors in the embodiment. In examples, the connectors 130a, 130d may respectively comprise sub-connectors 130a1, 130a2 and sub-connectors 130d1, 130d2. In other examples, about one-third of the length of a connector may wind around one device portion, whereas the other two-thirds of the length of the connector may wind around another adjacent device portion (not shown in FIG. 4G). The connector may have a totally different morphology than those described above. FIG. 5A is a top view schematically illustrating a connector 130 in an initial state according to one embodiment of the present disclosure. FIG. 5B depicts a top view illustrating the connector 130 in an extended state. The connector 130 comprises a plurality of arms 140 and a plurality of 90 degree-rotation-restriction joints 150. Any two adjacent arms 140 are joined by one of the 90 degree-rotation-restriction joints 150, and thus allowing the connector 130 to be deformable. Each of the 90 degree-rotation-restriction joints 150 comprises a body 152 and a first hook 156. The body 152 of the joints 150 has a first cavity 154 for joining to the arm 140. Furthermore, first hook 156 extends from the body 152 and may be operable to join to another arm. Each of the arms 140 comprises an end 147 having a second hook 148 that extends into the first cavity 154. The arm 140 further comprises an opposite end 144 having a second cavity 146 for housing a first hook 156 of another 90 degree-rotation-restriction joints.

When the connector 130 are extended or unraveled by providing pulling force, the connector 130 may be extended from a folded state depicted in FIG. 5A to a straight state depicted in FIG. 5B. In particular, the first and second hooks 156, 148 may be rotated within the second and first cavities 146, 154 respectively. Therefore, each of the arms 140 and joints 150 may be rotated relative to each other, and thus providing the connector 130 a deformable function.

In one example, the connector 130 may further comprise a plurality of metal wires 160, and each of the metal wires 160 is connected with an arm 140 and an adjacent 90 degree-rotation-restriction joint 150. The connector 130 may provide the function of electrical connection between two device portions by these metal wires 160. Particularly, it is noted that each of the arms 140 and the 90 degree-rotation-restriction joints 150 may comprise a conductive material or layer. Referring to FIG. 5A, point A may be electrically connected to point B through a metal wire 160, and then point B is electrically connected to point C through the conductive material formed in the arm 140. Furthermore, point C is electrically connected to point D through another metal wire. In this way, two device portions may be electrically connected through the connector 130 even though the connector 130 includes several rotating structure.

Figure 6:
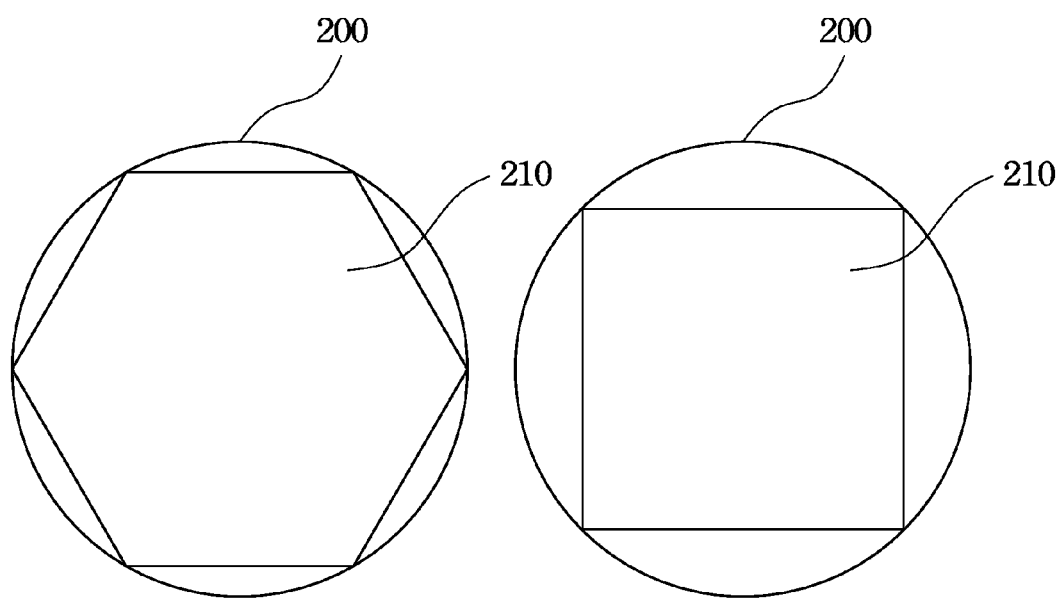
FIG. 6 is a top view schematically illustrating a layout of a deformable network structure formed on a substrate according to one embodiment of the present disclosure.

FIG. 6 is a top view schematically illustrating a layout of a deformable network structure 210 formed on a substrate 200 according to one embodiment of the present disclosure. The substrate 200 may be a silicon wafer, for example, on which the deformable network structure 210 in the initial state is formed. The region of network structure 210 may have a hexagonal shape or a square shape, as depicted in FIG. 6, or some other shapes.

Several processes used in microelectromechanical systems (MEMS) may be employed to form the network structure 210 on the substrate 200. For instance, a deep-reactive-ion etching (DRIE) may be used to define the device portions and the connectors, and followed by a process to remove the network structure from the substrate. In another example, the substrate 200 may be a silicon-on-insulator (SOI) wafer so that the network structure 210 may be fabricated thereon.

Figure 7:
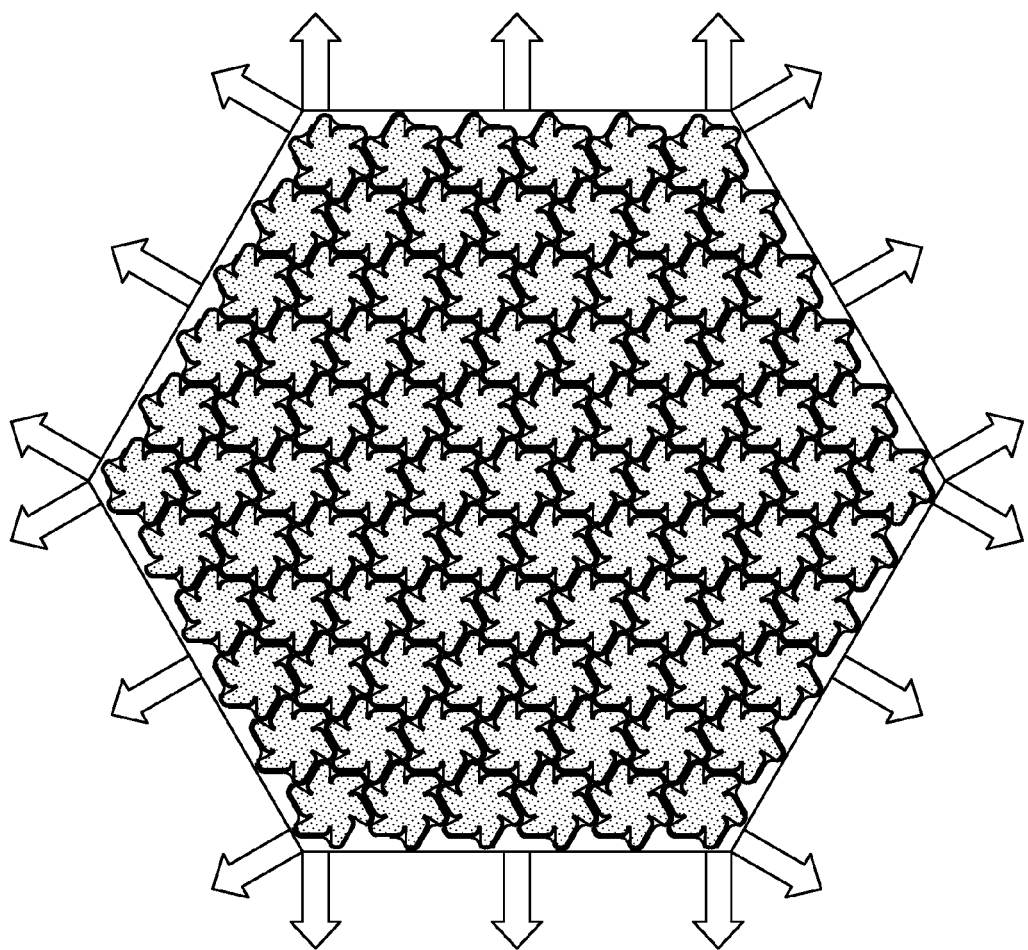
FIG. 7 is a top view schematically illustrating pulling force provided on a periphery of a deformable network structure according to one embodiment of the present disclosure.

The area out of the region of the deformable network structure 210 may be removed, as shown in FIG. 7. Pulling force may be provided on a portion of or all the periphery of the network structure 210, so as to extend or unravel the connectors formed in the network structure 210. Therefore, the deformable network structure may be extended from the initial state to the extended state. Multiple layers of supporting beam structure, as depicted in FIG. 10B, can be used to reduce the number of pulling sites even further.

Figure 8A:
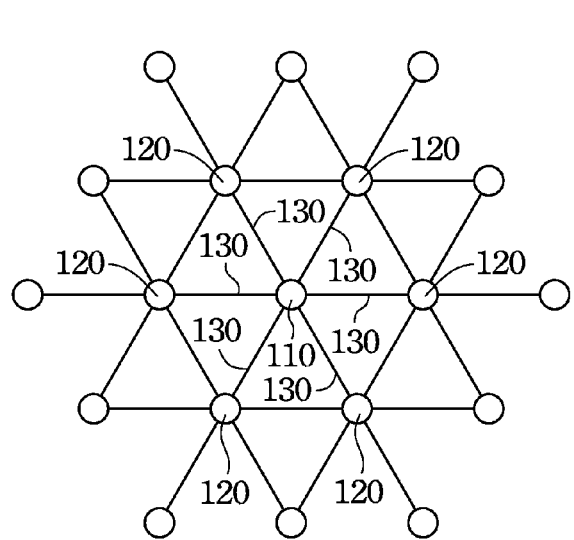
FIGS. 8A-8C are top views respectively schematically illustrating a deformable network structure in the extended state according to embodiments of the present disclosure.

FIG. 8A is a top view schematically illustrating a deformable network structure in the extended state according to one example of the present disclosure. In this example, one central portion 110 is connected with six surrounding portions 120 through connectors 130. In this extended state, an included angle formed between two adjacent connectors 130 is about 60 degrees.

Figure 8B:
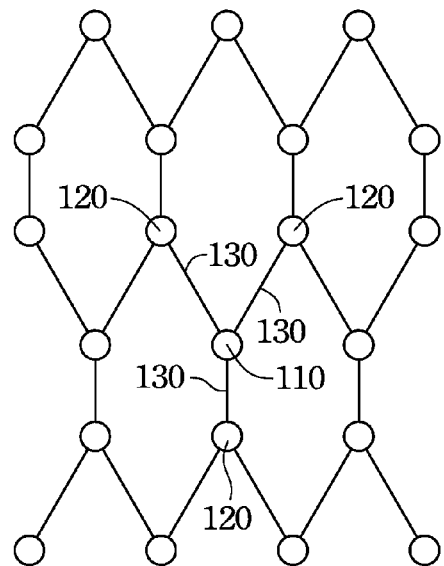

Although hereinbefore the number of the surrounding portions is illustrated by six, however, the number of the surrounding portions is not limited on the number of six. FIG. 8B is a top view schematically illustrating a deformable network structure, in which a central portion is surrounded by three surrounding portions, according to one embodiment of the present disclosure. In this embodiment, the deformable network structure comprises a central portion 110, three surrounding portions 120 and three connectors 130. Each of the central portion 110 and the surrounding portions 120 comprises a semiconductor device. Further, each of the surrounding portions 120 is connected to the central portion 110 through one of the connectors 130. The central portion 110 has a first center while each of the surrounding portions 120 has a second center. The connectors 130 may be deformable from an initial state to an extended state, such that the distance between the first center and one of the second centers in the extended state is at least 1.1 fold of the distance between the first center and the second center in the initial state. In one example, at least one of the connector 130 has a length that is different from another one. In other examples, an angle formed between two adjacent connectors 130, in the extended state, is about 120 degrees. In some examples, one or more device portions 120 may be replaced by node(s) which does not comprise any semiconductor element. Therefore, it is possible that one central portion 110 is connected with one or two surrounding portions 120 only.

Figure 8C:
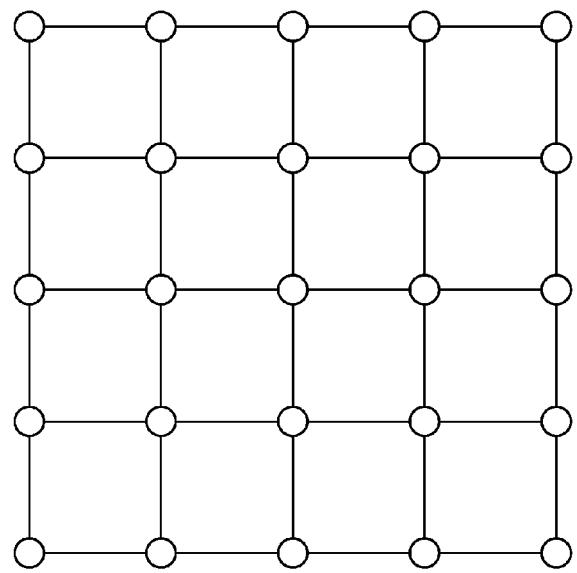

In another embodiment, one central portion may be connected with four surrounding portions, as depicted in FIG. 8C. In this embodiment, an angle formed between two adjacent connectors in the extended state is about 90 degrees.

It is noted that the embodiments depicted in FIG. 8A to FIG. 8C may be simultaneously implemented in a deformable network structure. For instance, the deformable network structure may include a first region and a second region. In the first region, each of the central portions may be connected with six connectors. In the second region, each of the central portions may be connected with four or three connectors. Therefore, each of the device portions in one region may possess a different amount of connectors from that in another region.

In one embodiment, at least one of the device portions (i.e. the central portion or surrounding portions) includes a radio frequency identification circuit, and at least one of the connectors comprises an antenna made of metal material.

In another embodiment, each of the device portions may independently provide an individual function, and the deformable network structure is configured to be diced into smaller units comprising part of the original network structure or into individual pieces each including a device portion. Alternatively, a group of the device portions may cooperate together to provide an individual function, for example, beamforming.

Figure 8D:
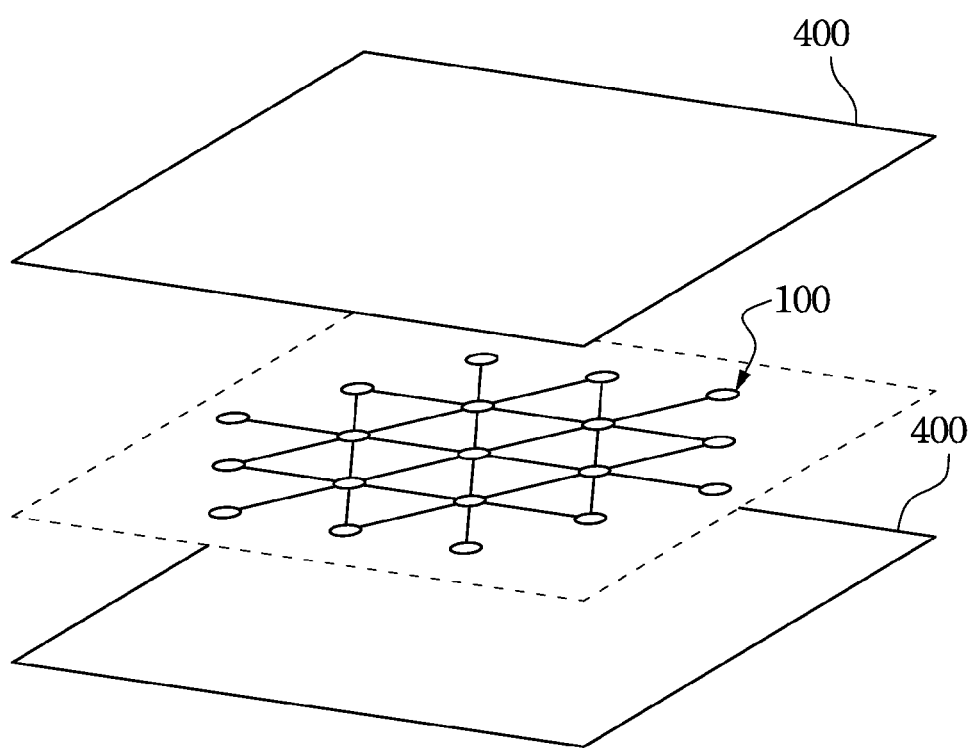
FIG. 8D is a perspective view schematically illustrating a deformable network structure having a fastening material according to embodiments of the present disclosure.

In yet another embodiment, the deformable network structure further includes a fastening material 400 to fasten the connectors while the connectors are situated in the final state, as depicted in FIG. 8D. For instance, the fastening material 400 may be an encapsulated material or a coated layer applied on the deformable network structure as the connectors reach the final state. The fastening material 400 is capable of providing protection, insulation, support or constraining the deformable network structure in either the initial state or the final state.

Figure 8E:
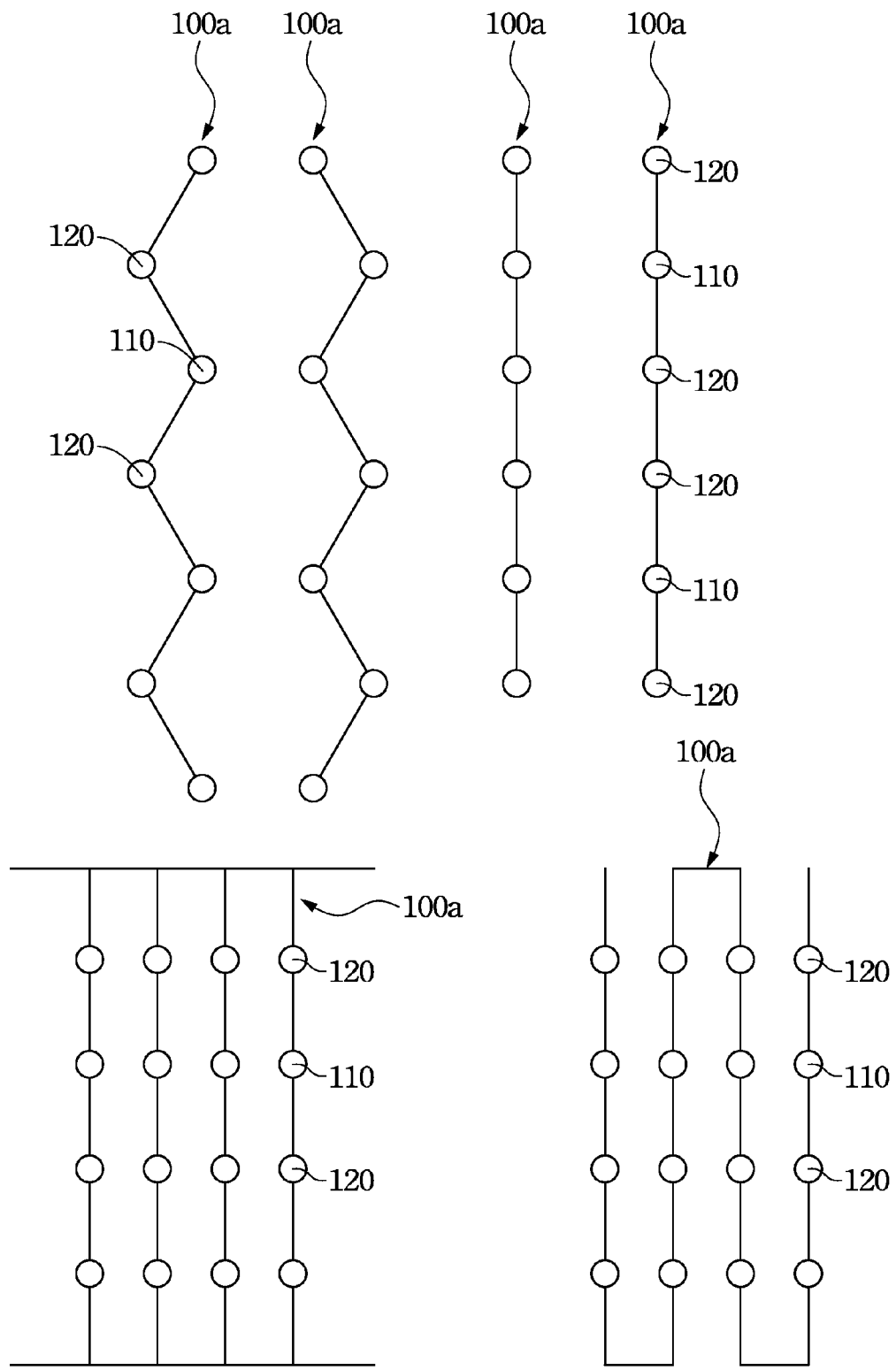
FIG. 8E is a top view schematically illustrating a deformable structure comprised of one or more one-dimensional string(s) in the final state according to one embodiments of the present disclosure.
Figure 8F:
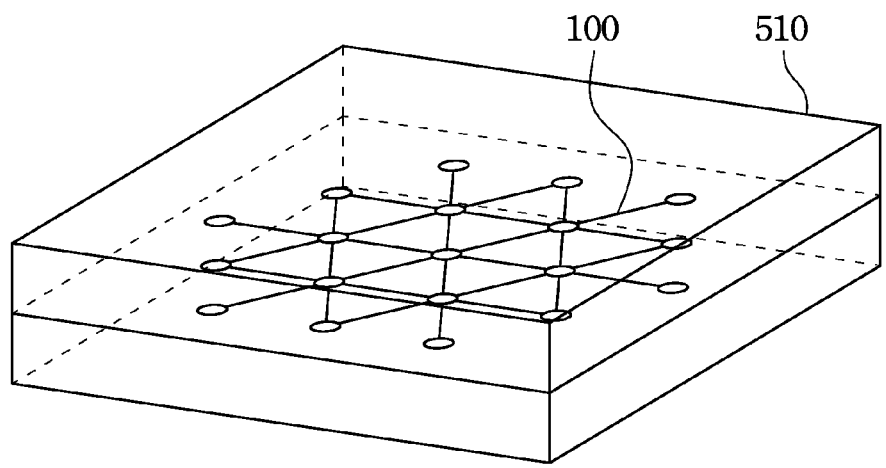
FIG. 8F and FIG. 8G are a perspective views schematically illustrating a composite structure according to embodiments of the present disclosure.
Figure 8G:
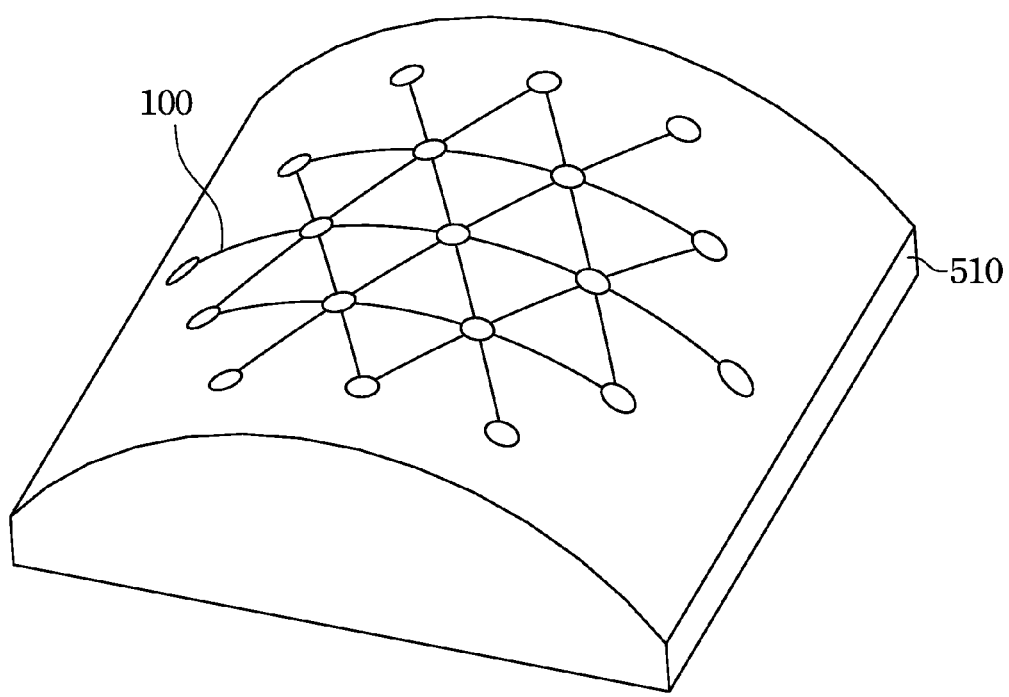
Figure 8H:
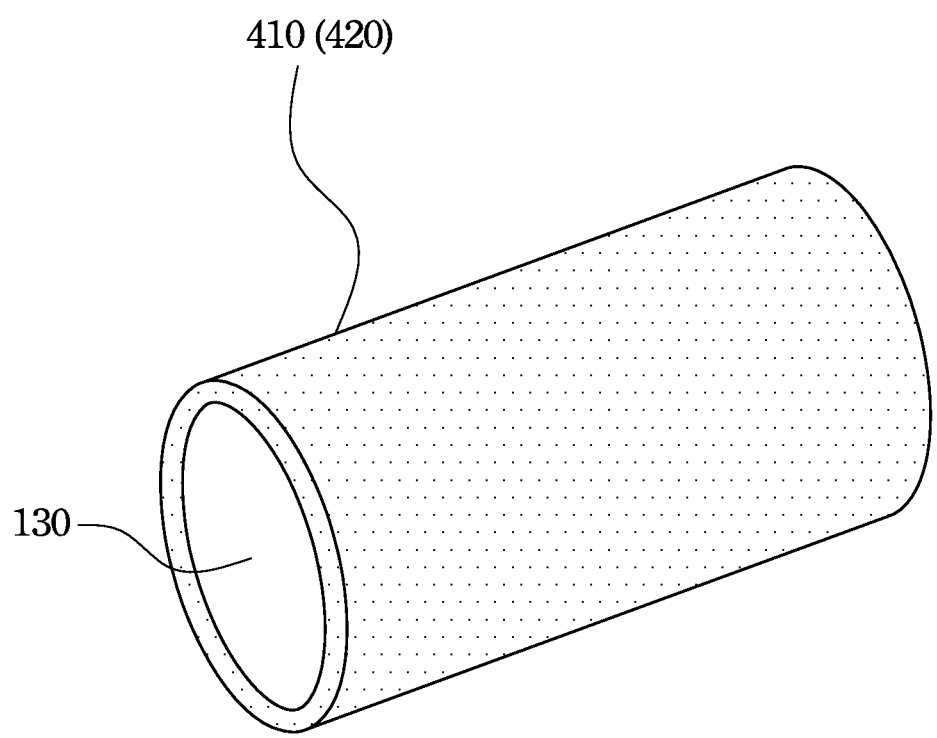
FIG. 8H is a perspective views schematically illustrating a connector wrapped with a strength-enhancing layer or an insulating layer.

In yet another embodiment, the deformable network structure may further includes a strength-enhancing layer 410 formed on an outer surface the connector 130, as depicted in FIG. 8H. The strength-enhancing layer 410 is configured to increase or enhance the strength or durability of the connector 130. For example, the strength-enhancing layer 410 can also be applied in a form that wraps around the connectors. A network with such wrapped connectors is porous. In yet another embodiment, the deformable network structure may further includes an insulating layer 420 formed on an outer surface of the connector 130, as depicted in FIG. 8H.

In still another embodiment, as depicted in FIG. 8E, the deformable network structure (or namely deformable structure) is comprised of one or more one-dimensional string(s) (or namely line(s)) 100a when the connectors are situated in the final state. Particularly, the connectors 130 of the deformable network structure 100 are arranged such that the central portion 110 and the surrounding portions 120 are connected in one or more one-dimensional string(s) 100a. Each of the one-dimensional strings 100a substantially extends in a direction. In one example, the one-dimensional strings 100a is arranged in a shape of sawtooth so that the device portions (i.e. central portion and surrounding portions) are not aligned with a straight line. In another example, the one-dimensional strings 100a may extend along a straight line.

Figure 9:
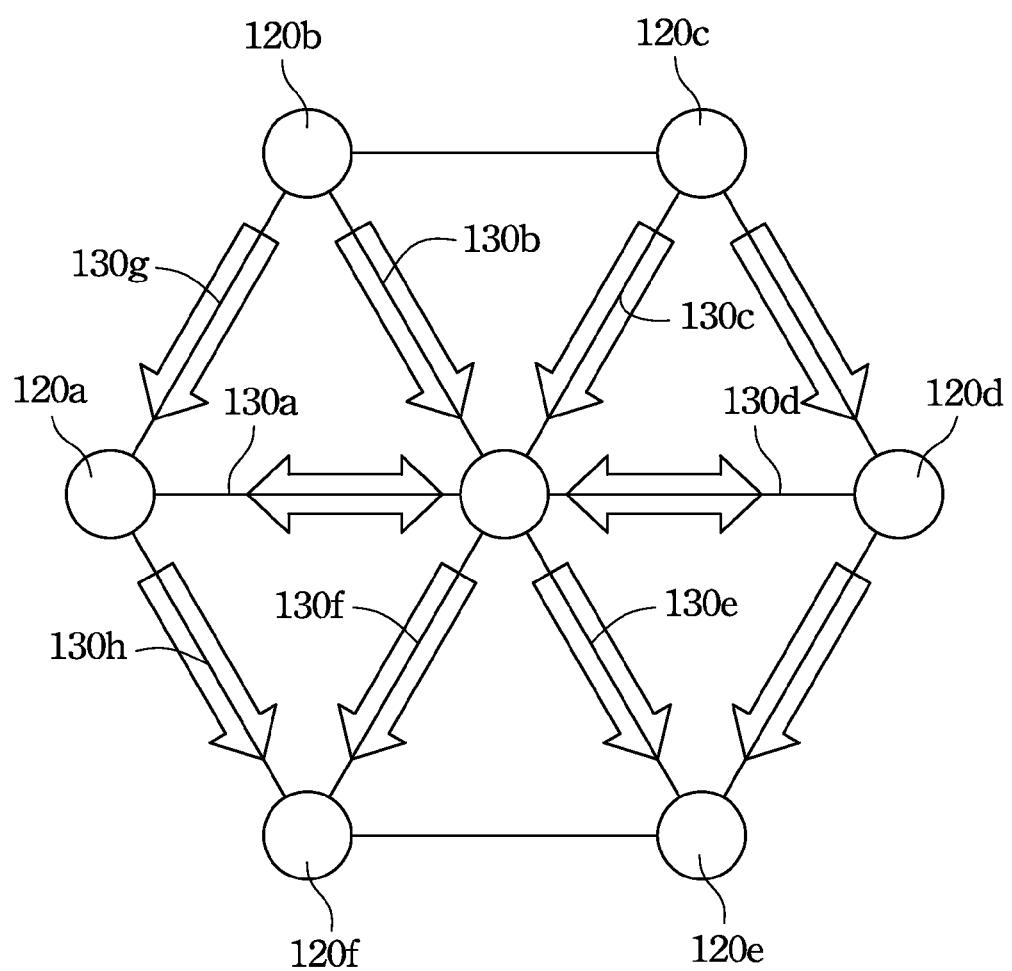
FIG. 9 illustrates an electrical connection between device portions according to one embodiment of the present disclosure.

According to another aspect of the present disclosure, a composite structure is provided. FIG. 8F is a perspective view schematically illustrating a composite structure 500 according to one embodiment of the present disclosure. The composite structure 500 includes a deformable structure 100 and a carrier substrate 510. Any deformable network structure (or deformable structure) described in this disclosure may be used. The carrier substrate 510 is configured to carry the deformable structure 100 while the connectors of the deformable structure 100 are in either the initial state or the final state. The deformable structure 100 may be integrated into or embedded in the carrier substrate 510. For instance, the carrier substrate 510 may be a fabric, a piece of cloth, or carbon fiber composites, and the deformable structure 100 may be integrated into carrier substrate 510. Otherwise, the carrier substrate 510 may be a building material such as concrete, and the carrier substrate 510 is embedded in the concrete. In other examples, the deformable structure 100 may be surface mounted or stuck onto a surface of the carrier substrate 510 such as wood, as depicted in FIG. 8G. FIG. 9 illustrates an electrical connection between device portions according to one embodiment of the present disclosure. In this embodiment, each device portion is connected with six connectors, for example connectors 130a-130f. Particularly, the device portion 110 is provided with two connectors 130b and 130c for receiving electric signals, and is also provided with another two connectors 130e and 130f for outputting electric signals. The device portion 120b may be electrically connected to device portion 120f either through the connectors 130b, 130f or through the connector 130g, 130h. Therefore, the network structure is possible to be automatically reconfigured when one connector breaks. Furthermore, the other two connectors 130a and 130d may be used to transmit other signals in certain applications. Alternatively, the connectors 130a, 130d may be used to form an electrical connection in parallel.

Figure 10A:
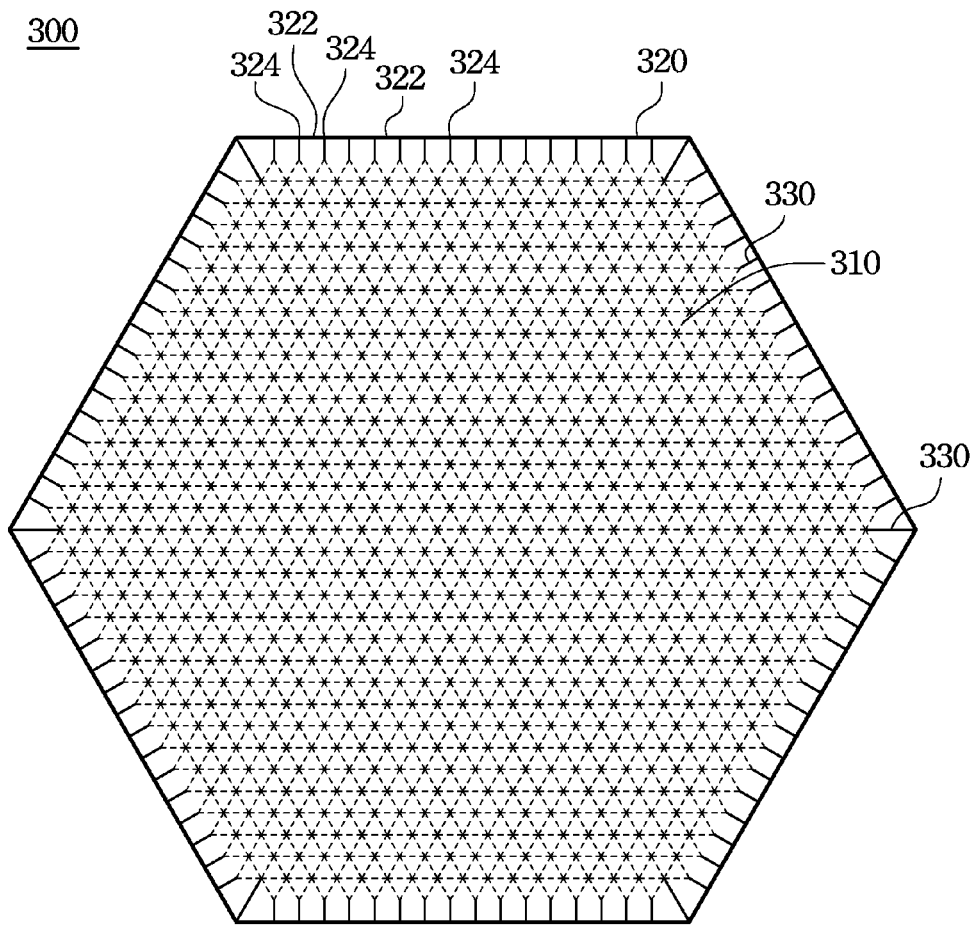
FIG. 10A is a top view schematically illustrating a deformable network structure in an initial state according to one embodiment of the present disclosure.
Figure 10B:
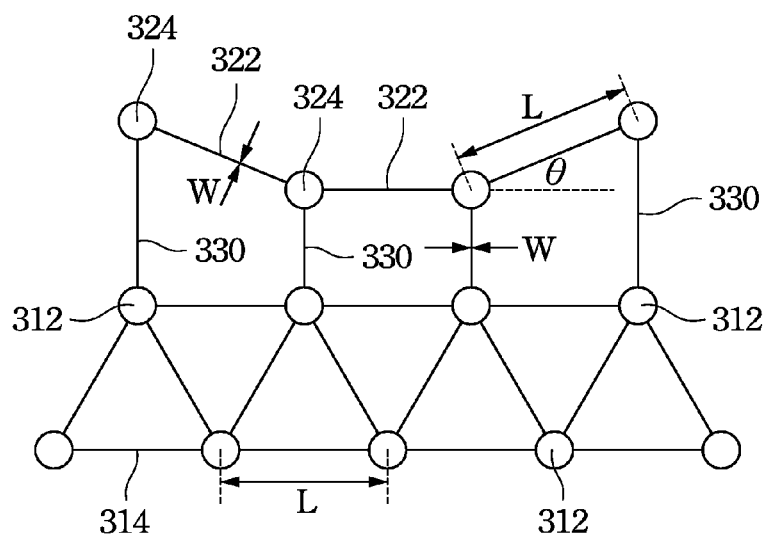
FIG. 10B is a top view schematically illustrating an extended state of the deformable network structure depicted in FIG. 10A.

FIG. 10A is a top view schematically illustrating a deformable network structure 300 in an initial state according to one embodiment of the present disclosure. FIG. 10B schematically illustrates an extended state of the deformable network structure 300.

Referring to FIG. 10A and FIG. 10B, the deformable network structure 300 includes a device network 310 arranged therein. The device network 310 includes a plurality of device portions 312 and a plurality of first connectors 314. Any two adjacent device portions are electrically connected by one of the first connectors 314, and thereby forming the device network 310.

The deformable network structure 300 further includes a supporting beam 320 that surrounds the device network 310. The supporting beam 320 comprises a plurality of second connectors 322 and a plurality of nodes 324.

Any two adjacent nodes 324 are physically connected by a second connector 322. The supporting beam 320 forms a closed-loop surrounding the device network 310. In one example, at least one of the second connectors 322 has a length L that is different from another second connector 322. Specifically, an angle θ, which is between 0 degree and 90 degrees, is formed between two adjacent second connector 322 when the deformable network structure 300 is in the extended state. Accordingly, the two adjacent second connectors 322 may be design to have different lengths from each other. In another example, each of the second connectors 322 is composed of two or more sub-connectors arranged in parallel for the purpose of increasing the mechanical strength of the supporting beam 320. In still another example, the width W of each of the second connectors 322 may be different from each of the first connectors 314.

Furthermore, deformable network structure 300 includes a plurality of third connectors 330 disposed between the supporting beam 320 and the device network 310. Each of the third connectors 330 is connected with a node 324 of the supporting beam 320 and a device portion 312 that is located at a periphery of the device network 310.

In this embodiment, each of the peripheral device portions 312, which are positioned at the outmost edge of the device network 310, is connected with totally five connectors (i.e. one connector 330 and four connectors 314). The other device portions, which are positioned in the inner of the device network 310, are respectively connected with six connectors 314. That is to say, each of the peripheral device portions may possess a different amount of connectors from the other device portions, placed in the inner of the device network 310. In another example, the peripheral device portion 312 may have a different shape from the rest of the device portion positioned in the inner of the device network 310. The first, second and third connectors 314, 322, 330 may be any example connector described hereinbefore. Each of the first, second and third connectors 314, 322, 330 is deformable from an initial state to an extended state, such that a spacing interval existed between two adjacent device portions 312 in the extended state is at least 1.1 fold of a spacing interval existed between the two device portions in the initial state. While the deformable network structure 300 is in the extended state, the third connectors 330 provide a tension to the periphery of the device network 310 so as to allow the device portions 312 in the device network 310 to be located at desired positions. For this purpose, at least one of the third connectors 330 may have a length that is different from another third connector 330. For instance, two adjacent third connectors 330 may be configured to have different lengths from each other, as depicted in FIG. 10B. In another example, the width of each of the third connectors 330 is different from each of the first connectors 314.

Figure 10C:
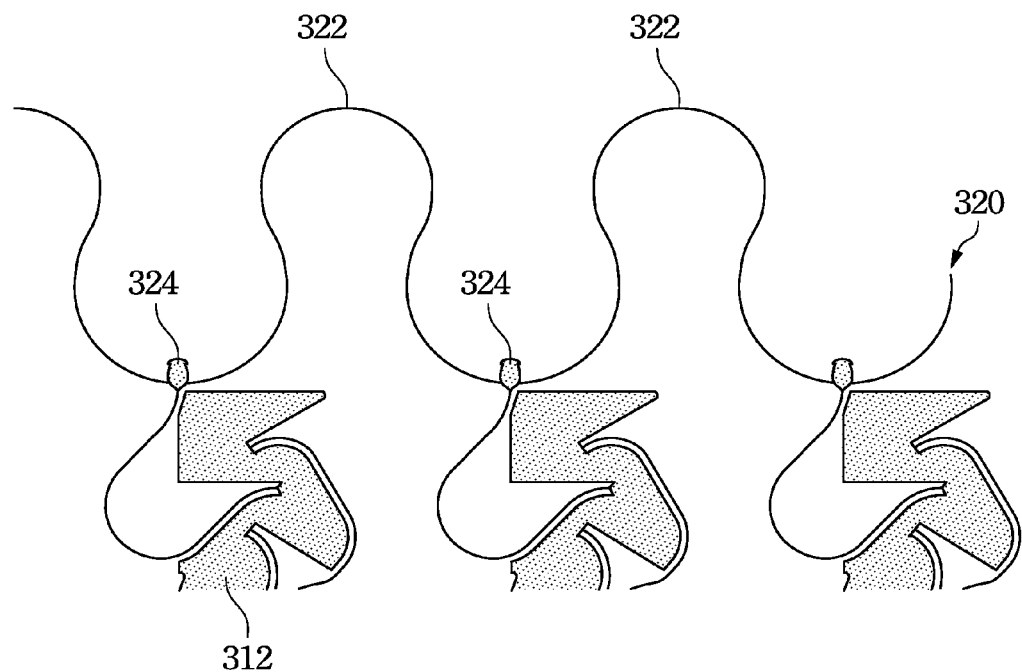
FIG. 10C is a top view schematically illustrating a supporting beam in an initial state according to one embodiment of the present disclosure.
Figure 10D:
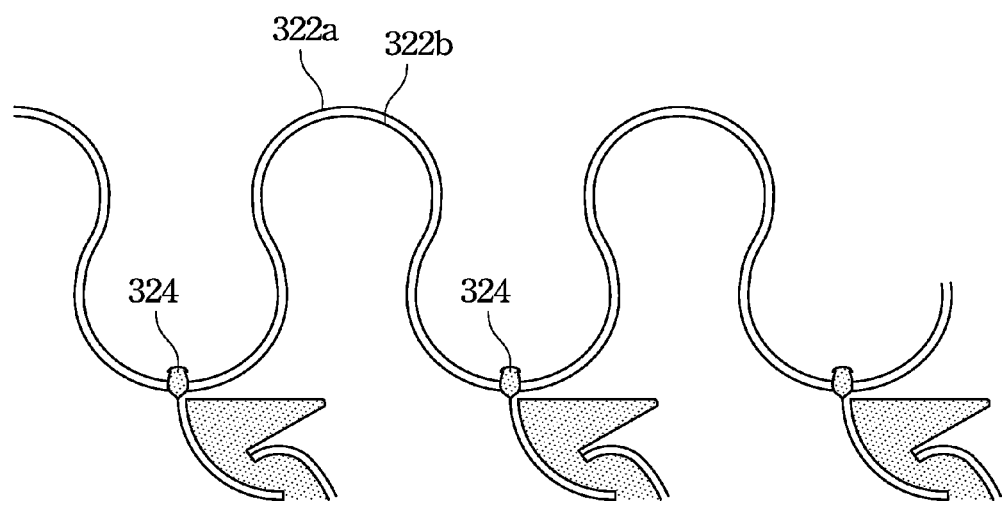
FIG. 10D is a top view schematically illustrating a supporting beam in an initial state according to another embodiment of the present disclosure.

FIG. 10C is a top view schematically illustrating a supporting beam in an initial state according to one embodiment of the present disclosure. Similarly, the supporting beam 320 may comprise a plurality of second connectors 322 and a plurality of nodes 324. Each of the second connectors 322 twists between two adjacent nodes 324, so that the length of the second connector 322 is longer than the distance between two adjacent nodes 324. Each of the second connectors 322 may comprise two or more sub-connectors, as depicted in FIG. 10D. Particularly, each of the second connectors 322 is composed of two sub-connectors 322a, 322b.

Figure 11:
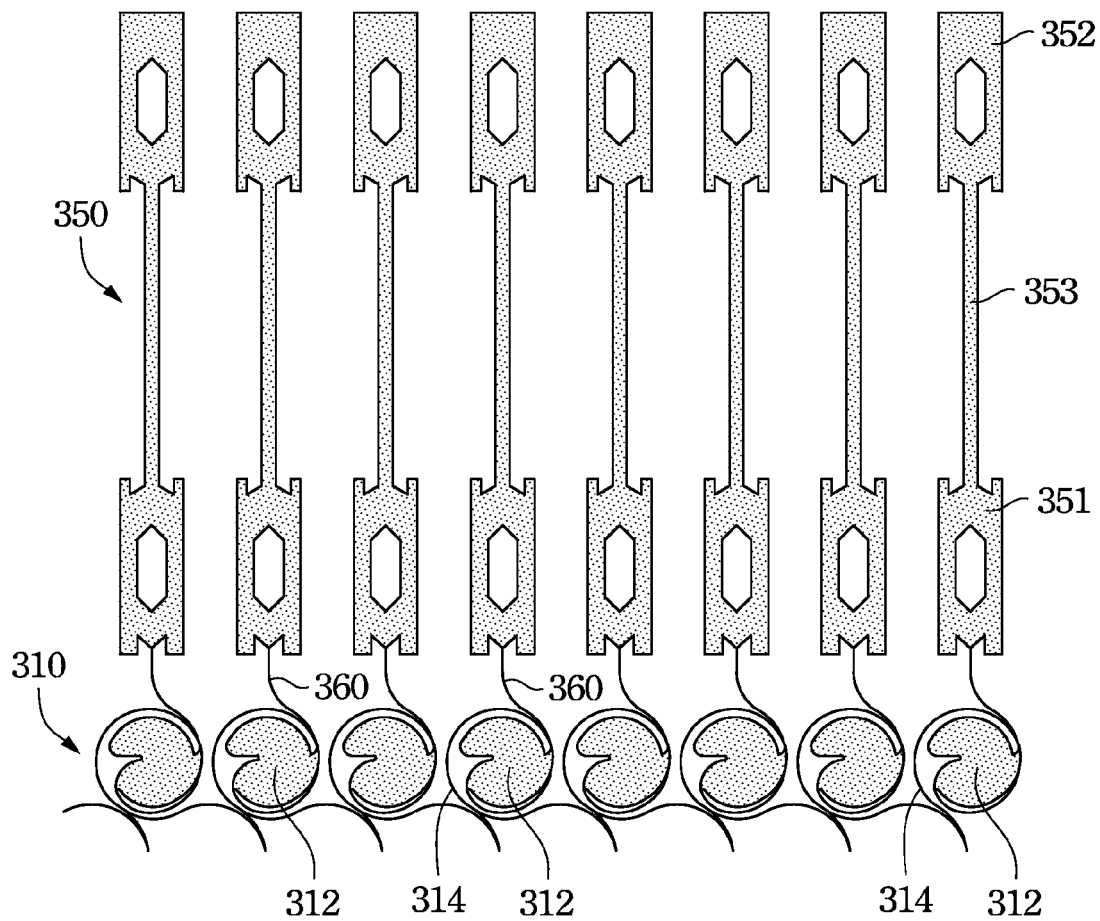
FIG. 11 is a top view schematically illustrating a deformable network structure in an initial state according to another embodiment of the present disclosure.

FIG. 11 is a top view schematically illustrating a deformable network structure 300 in an initial state according to another embodiment of the present disclosure. The deformable network structure 300 comprises a device network 310, a plurality of pulling pads 350 and a plurality of pulling wires 360. The device network 310 may have a structure similar to those described above in connection with FIG. 10A-10D. The pulling pads 350 are disposed at a periphery of the device network 310, and are configured to deploy the device network 310. Each of the pulling wires 360 interconnects between one of the pulling pads 350 and the device network 310.

In one embodiment, each of the pulling pads 350 is connected to only one peripheral device portion 312 through a pulling wire 360 only. The pulling wire 360 may have a structure that is the same as or different from the first connectors 314. In one example, the mechanical strength of the pulling wire 360 is different from that of the first connectors 314.

In another embodiment, the amount of the pulling pads 350 is less than the amount of the peripheral device portion 312. In this case, a portion of the peripheral device portions 312 is not connected to the pulling pad 350 through the pulling wire 360.

In still another embodiment, each of the pulling pads 350 has a maximum dimension different from that of each of the device portions 312. Specifically, each of the pulling pads 350 includes a first portion 351, a second portion 352 and a neck portion 353 interconnected therebetween. The neck portion 353 may be straight in shape as depicted in FIG. 11. However, in some examples, the neck portion 353 may be coiled up or twisted like the connectors described hereinbefore. Both the first and the second portion 351, 352 are capable of being attached to an article or machine for deploying the deformable network structure 300. It is noted that each of the pulling pads 350 may have a shape that is substantially the same as the device portion 312 although the pulling pads 350 depicted in FIG. 11 is different from the device portion in shape.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A deformable network structure, comprising:
a first and a second device portion respectively having a first and a second center; and
at least one connector interconnected between the first device portion and the second device portion such that the second device portion is connected to the first device portion, wherein the connector is deformable from an initial state to a final state, and the connector has a breaking strain and a parameter Z that is less than the breaking strain;
wherein the parameter Z is defined by the following formula:

$$Z = \left| \frac{\left(-\frac{W}{2}\right)\left(\frac{1}{R_f} - \frac{1}{R_i}\right)}{1 - \frac{W}{2R_i}} \right|;$$

wherein W represents a width of a portion of the connector, $R_f$ represents a radius of curvature of the portion of the connector in the final state, and $R_i$ represents a radius of curvature of the portion of the connector in the initial state.

2. The deformable network structure of claim 1, wherein the connector provides an electrical connection between the first and the second device portions.

3. The deformable network structure of claim 1, wherein a first distance between the first and second centers in the final state varies at least 10% of a second distance between the first and second centers in the initial state contributed by a deformation of the connector.

4. The deformable network structure of claim 3, wherein the first distance between the first and second centers in the final state is less than 90% of the second distance between the first and second centers in the initial state.

5. The deformable network structure of claim 3, wherein the first distance between the first and second centers in the final state is greater than 1.1 fold of the second distance between the first and second centers in the initial state.

6. The deformable network structure of claim 1, wherein the first and second centers are geometric centers, mass centers or centers of symmetry.

7. The deformable network structure of claim 1, wherein the first and second device portions and the connector share a common material layer.

8. The deformable network structure of claim 1, wherein the first and second device portions and the connector are substantially arranged on different levels.

9. The deformable network structure of claim 1, wherein the first and second device portions are of identical shapes.

10. The deformable network structure of claim 1, wherein each of the first and second device portions comprises a semiconductor element, a light emitting element, a piezoelectric element, a circuit element, a sensor, an actuator, a transducer, an energy harvesting element, an energy storage element, an element that affects or interacts with surrounding electromagnetic field, air flow, mass flow or acoustic property, or a radio frequency identification circuit element.

11. The deformable network structure of claim 1, wherein the connector comprises an antenna.

12. The deformable network structure of claim 1, further comprising a fastening material to fasten the connector in one of the initial state and the final state.

13. The deformable network structure of claim 1, further comprising a strength-enhancing layer formed on an outer surface of the connector, wherein the strength-enhancing layer is configured to increase a strength of the connector.

14. The deformable network structure of claim 1, further comprising an insulating layer formed on an outer surface of the connector.

15. The deformable network structure of claim 1, wherein each of the first and second device portions comprises:
a body; and
a plurality of petal portions extended from the body;
wherein the connector physically interconnects between the bodies of the first and second device portions,
wherein the connector extends along an edge of one of the petal portions of the first device portion and along an edge of one of the petal portions of the second device portion in one of the initial state and the final state.

16. The deformable network structure of claim 1, wherein the connector winds around in a space in a vicinity of one of the first and the second device portions while the connector is in one of the initial state and the final state.

17. The deformable network structure of claim 1, further comprising a plurality of bridges, wherein each of the bridges interconnects between the connector and one of the first and the second device portions in one of the initial state and the final state.

18. The deformable network structure of claim 1, further comprising a plurality of bridges, wherein each of the bridges interconnects between a portion of the connector and another portion of the connector in one of the initial state and the final state.

19. The deformable network structure of claim 1, further comprising a plurality of bridges, wherein the at least one connector includes a plurality of connectors, and each of the bridges interconnects between two of the connectors in one of the initial state and the final state.

20. The deformable network structure of claim 1, wherein each of the first and the second device portions provides an individual function, and the deformable network structure is configured to be diced into a plurality of individual pieces each including one of the first and the second device portions.

21. A deformable structure, comprising:
at least one central portion having a first center;
at least two surrounding portions arranged around the central portion, and each of the surrounding portions having a second center; and
at least two connectors, wherein each of the surrounding portions is connected to the central portion through one of the connectors;
wherein each of the connectors is deformable from an initial state to a final state, and each of the connectors has a parameter Z and a breaking strain, and the parameter Z of said each of the connectors is less than the breaking strain thereof,
wherein the parameter Z is defined by the following formula:

$$Z = \left| \frac{\left(-\frac{W}{2}\right)\left(\frac{1}{R_f} - \frac{1}{R_i}\right)}{1 - \frac{W}{2R_i}} \right|;$$

wherein W represents a width of a portion of any one of the connectors, $R_f$ represents a radius of curvature of the portion of said any one of the connectors in the final state, and $R_i$ represents a radius of curvature of the portion of said any one of the connectors in the initial state.

22. The deformable structure of claim 21, wherein each of the connectors provides an electrical connection between the central portion and one of the surrounding portions.

23. The deformable structure of claim 21, wherein the connectors are arranged such that the central portion and the at least two surrounding portions are connected in a one-dimensional strings.

24. The deformable structure of claim 21, wherein the deformable structure is configured to be diced into a plurality of small units each comprising parts of the at least two surrounding portions and the central portion.

25. A deformable network structure, comprising:
a first and a second device portion respectively having a first and a second center; and
at least one connector interconnected between the first device portion and the second device portion such that the second device portion is connected to the first device portion, wherein the connector is deformable from an initial state to a final state, and the connector has a breaking strain and a parameter Y that is less than the breaking strain;
wherein the parameter Y is defined by the following formula:

$$Y = \left| \frac{\left(\frac{W}{2}\right)\left(\frac{1}{R_f} - \frac{1}{R_i}\right)}{1 + \frac{W}{2R_i}} \right|;$$

wherein W represents a width of a portion of the connector, $R_f$ represents a radius of curvature of the portion of the connector in the final state, and $R_i$ represents a radius of curvature of the portion of the connector in the initial state.

26. A composite structure, comprising:
a deformable structure, comprising:
a first and a second device portion respectively having a first and a second center; and
at least one connector interconnected between the first device portion and the second device portion such that the second device portion is connected to the first device portion, wherein the connector is deformable from an initial state to a final state, and the connector has a breaking strain and a parameter Z that is less than the breaking strain;
wherein the parameter Z is defined by the following formula:

$$Z = \left| \frac{\left(-\frac{W}{2}\right)\left(\frac{1}{R_f} - \frac{1}{R_i}\right)}{1 - \frac{W}{2R_i}} \right|;$$

wherein W represents a width of a portion of the connector, $R_f$ represents a radius of curvature of the portion of the connector in the final state, and $R_i$ represents a radius of curvature of the portion of the connector in the initial state; and
a carrier substrate for carrying the deformable structure in either the initial state or the final state.

27. The composite structure of claim 26, wherein the deformable structure is integrated into, embedded in, surface mounted or stuck onto the carrier substrate.

28. The composite structure according to claim 26, wherein the carrier substrate includes at least one of fabric, carbon fiber composites, wood and concrete.

* * * * *